United States Patent
Sakamoto et al.

(10) Patent No.: US 11,094,687 B2
(45) Date of Patent: Aug. 17, 2021

(54) TEMPERATURE CHARACTERISTIC ADJUSTMENT CIRCUIT

(71) Applicant: ASAHI KASEI MICRODEVICES CORPORATION, Tokyo (JP)

(72) Inventors: Toshiro Sakamoto, Tokyo (JP); Yuukou Tsushima, Tokyo (JP)

(73) Assignee: Asahi Kasei Microdevices Corporation, Tokyo (JP)

( * ) Notice: Subject to any disclaimer, the term of this patent is extended or adjusted under 35 U.S.C. 154(b) by 110 days.

(21) Appl. No.: 16/473,811

(22) PCT Filed: Oct. 3, 2017

(86) PCT No.: PCT/JP2017/036031
§ 371 (c)(1),
(2) Date: Jun. 26, 2019

(87) PCT Pub. No.: WO2018/123188
PCT Pub. Date: Jul. 5, 2018

(65) Prior Publication Data
US 2020/0152618 A1  May 14, 2020

(30) Foreign Application Priority Data
Dec. 27, 2016 (JP) .............................. JP2016-253453

(51) Int. Cl.
*H01L 27/02* (2006.01)
*H01L 29/788* (2006.01)
(Continued)

(52) U.S. Cl.
CPC .......... *H01L 27/0211* (2013.01); *G05F 3/245* (2013.01); *G11C 16/30* (2013.01); *H01L 29/7883* (2013.01)

(58) Field of Classification Search
CPC ............. H01L 27/0211; H01L 29/7883; H01L 27/115; H01L 29/788; H01L 29/792;
(Continued)

(56) References Cited

U.S. PATENT DOCUMENTS 4,912,749 A  3/1990 Maruyama et al.
5,930,171 A  7/1999 Zettler
(Continued)

FOREIGN PATENT DOCUMENTS

EP  0280883 A2  9/1988
JP  H05-119859 A  5/1993
(Continued)

OTHER PUBLICATIONS

International Preliminary Report on Patentability dated Jul. 2, 2019, for the corresponding International Application No. PCT/JP2017/036031.

(Continued)

*Primary Examiner* — Thanhha S Pham
(74) *Attorney, Agent, or Firm* — Morgan, Lewis & Bockius LLP

(57) ABSTRACT

This invention aims at providing a temperature characteristic adjustment circuit capable of adjusting the temperature characteristic to various positive and negative temperature characteristics with an excessively small characteristic variation and capable of suppressing an increase in the chip area and the current consumption with a simple circuit configuration. A temperature characteristic adjustment circuit has a current source having a nonvolatile storage element having a control gate region and a source region and driven by the application of a bias between the control gate region and the source region and an output circuit not having a nonvolatile storage element, in which the temperature dependency of an output signal originating from the temperature dependency of the current amount of a current output from the current source is adjusted by the nonvolatile storage element.

10 Claims, 17 Drawing Sheets

(51) Int. Cl.
*G11C 16/30* (2006.01)
*G05F 3/24* (2006.01)

(58) Field of Classification Search
CPC . G05F 3/24; G05F 3/242; G05F 3/245; G11C 16/06; G11C 16/30; G11C 16/105
See application file for complete search history.

(56) References Cited

U.S. PATENT DOCUMENTS

| | | |
|---|---|---|
| 6,452,437 B1 | 9/2002 | Takeuchi et al. |
| 2002/0109539 A1 | 8/2002 | Takeuchi et al. |
| 2018/0053789 A1* | 2/2018 | Faul .................. H01L 23/50 |

FOREIGN PATENT DOCUMENTS

| | | |
|---|---|---|
| JP | 2001-35177 A | 2/2001 |
| JP | 2010-170533 A | 8/2010 |
| JP | 2015-171258 A | 9/2015 |
| JP | 2016-129293 A | 7/2016 |

OTHER PUBLICATIONS

International Search Report issued in corresponding International Patent Application No. PCT/JP2017/036031 dated Nov. 28, 2017.
Office Action issued in corresponding European Patent Application No. 17888976.2, dated Dec. 16, 2019.
Supplementary European Search Report (SESR) issued in corresponding European Patent Application No. 17888976.2, dated Nov. 26, 2019.

* cited by examiner

TEMPERATURE CHARACTERISTIC ADJUSTMENT CIRCUIT

TECHNICAL FIELD

The present invention relates to a temperature characteristic adjustment circuit provided with a nonvolatile storage element and adjusting the temperature characteristics.

BACKGROUND ART

A semiconductor device has temperature characteristics, and therefore the performance of an integrated circuit (IC) generally exhibits the temperature dependency. Therefore, the temperature characteristics need to be adjusted by attaching a temperature compensation circuit to the IC according to the required specification of the IC. As an example of the temperature compensation circuit, PTL 1 discloses a voltage generation circuit illustrated in FIG. 28. The voltage generation circuit is configured including current sources 501 and 502 generating a constant current independent of the temperature, current sources 503 and 504 generating a current proportional to the temperature, MOS transistors PA1, PA2, NA1, and NA2, and a resistor Rout. By supplying enabling signals EN1b, EN2, EN3b, and EN4 to the gate of each of the MOS transistors and selectively using the current sources, the temperature characteristic of an output voltage Vout can be variously adjusted to both positive/negative temperature characteristics. By using a circuit capable of adjusting the temperature characteristic as a first circuit in combination with another second circuit having a temperature characteristic, the second circuit can be temperature-compensated.

A current source circuit actually used in the circuit of FIG. 28 is illustrated in FIGS. 29 and 30. FIG. 29 illustrates a circuit generating a constant current independent of the temperature used in the current sources 501 and 502. A reference potential Vref of an operational amplifier OP2 is generated in a band gap reference circuit illustrated in FIG. 31. FIG. 30 illustrates a circuit generating a current proportional to the temperature used in the current sources 503 and 504.

CITATION LIST

Patent Literature

PTL 1: JP 2001-35177 A

SUMMARY OF INVENTION

Technical Problem

However, in the voltage generation circuits containing the circuits illustrated in FIGS. 29, 30, and 31, the circuit scale is large and the operational amplifier is used, and therefore manufacturing variations of a mismatch coefficient and the like need to be considered. Therefore, the voltage generation circuit disclosed in PTL 1 has disadvantages in that the chip area increases or the current consumption increases.

It is an object of the present invention to provide a temperature characteristic adjustment circuit capable of adjusting the temperature characteristic to various positive and negative temperature characteristics with an excessively small characteristic variation and capable of suppressing an increase in the chip area and the current consumption with a simple circuit configuration.

Solution to Problem

In order to achieve the object, a temperature characteristic adjustment circuit according to one aspect of the present invention has a current source configured to have a nonvolatile storage element having a control gate region and a source region and to be driven by the application of a bias between the control gate region and the source region and an output circuit not having a nonvolatile storage element, in which temperature dependency of an output signal originating from temperature dependency of a current amount of a current output from the current source is adjusted by the nonvolatile storage element.

Advantageous Effects of Invention

According to one aspect of the present invention, the temperature characteristics can be adjusted to various positive and negative temperature characteristics with an excessively small characteristic variation and an increase in the chip area and the current consumption can be suppressed with a simple circuit configuration.

DESCRIPTION OF EMBODIMENTS

Next, embodiments of the present invention will now be described with reference to the drawings. Herein, a nonvolatile storage element to be used as a temperature characteristic adjustment circuit is described taking an N-type field effect transistor provided with a floating gate region and a control gate region illustrated in FIG. 1 as an example. However, the nonvolatile storage element is not limited to this structure and is not limited to the N-type insofar as the nonvolatile storage element is a transistor provided with a charge accumulation region.

First Embodiment

Figure 1:
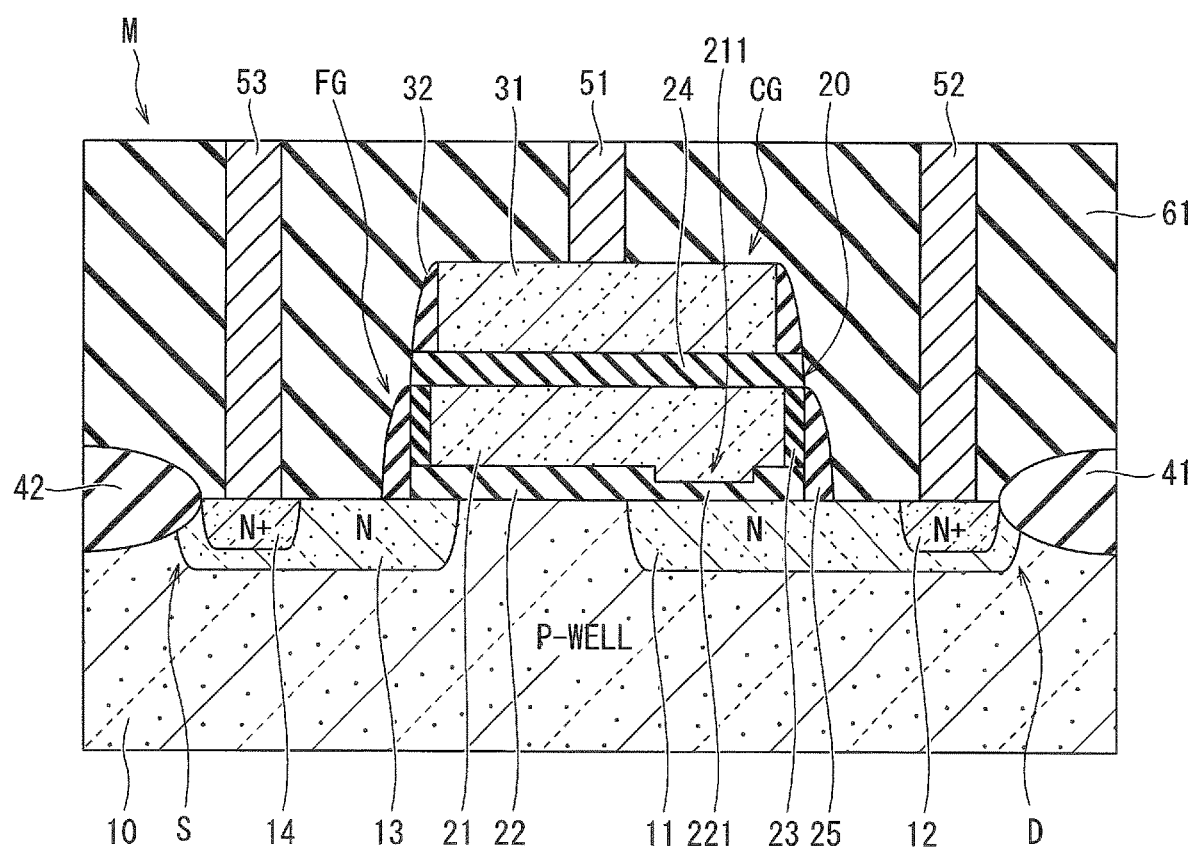
FIG. 1 is a cross-sectional view illustrating the schematic configuration of a nonvolatile storage element M provided in a temperature characteristic adjustment circuit according to a first embodiment of the present invention.

As illustrated in FIG. 1, a nonvolatile storage element M provided in a current source according to this embodiment is provided with a P-well region 10 formed in a semiconductor substrate, a floating gate region FG formed on the P-well region 10, and a control gate region CG formed on the floating gate region FG. Moreover, the nonvolatile storage element M is provided with a drain region D formed in one of both sides of a lower portion of the floating gate region FG and a source region S formed in the other one of both the sides of the lower portion of the floating gate region FG. The drain region D and the source region S are formed in the P-well region 10. The nonvolatile storage element M is element-separated from the other elements formed in the same semiconductor substrate by element separation regions 41 and 42.

The floating gate region FG contains a charge holding region 21 and an insulator 20. More specifically, the nonvolatile storage element M is provided with the charge holding region 21 and the insulator 20 disposed surrounding the charge holding region 21. The insulator 20 has a gate insulation film 22 formed under the charge holding region 21, a lateral wall oxide film 23 formed by oxidizing the lateral wall of the charge holding region 21, and an upper insulation film 24 formed above the charge holding region 21. A sidewall 25 is formed around the gate insulation film 22 and the lateral wall oxide film 23.

In the gate insulation film 22, a tunnel insulation film 221 is formed. The tunnel insulation film 221 is a portion which is formed to have a relatively thin film thickness in the gate insulation film 22. A region where the tunnel insulation film 221 is formed serves as a charge inlet 211 injecting charges into the charge holding region 21 or releasing charges from the charge holding region 21. More specifically, the charge holding region 21 has the charge inlet 211 for injecting charges or releasing charges.

The control gate region CG has a polysilicon film 31 formed on the upper insulation film 24. Around the polysilicon film 31, a sidewall 32 formed on the upper insulation film 24 is formed.

The drain region D has an N-type region 11 and an N-type N+ region 12 having an impurity concentration higher than that of the N-type region 11. The N+ region 12 is provided in order to obtain an ohmic contact of the drain region D and a contact plug 52 described later.

The source region S has an N-type region 13 and an N-type N+ region 14 having an impurity concentration higher than that of the N-type region 13. The N+ region 14 is provided in order to obtain an ohmic contact of the source region S and a contact plug 53 described later. The drain region D and the source region S are defined by a direction where a current flows. Therefore, when the direction where a current flows is reversed to a current assumed in the nonvolatile storage element M illustrated in FIG. 1, the drain region D illustrated in FIG. 1 serves as the source region S and the source region S serves as the drain region D.

The nonvolatile storage element M is provided with a protective film 61 formed on the control gate region CG, the floating gate region FG, the drain region D, and the source region S. In the protective film 61, an opening portion exposing a part of the polysilicon film 31 of the control gate region CG as the bottom surface is formed. In the opening portion, a contact plug 51 is formed to be embedded. Thus, the contact plug 51 and the polysilicon film 31 of the control gate region CG are electrically connected.

In the protective film 61, an opening portion exposing a part of the N+ region 12 of the drain region D as the bottom surface is formed. In the opening portion, a contact plug 52 is embedded. Thus, the contact plug 52 and the N+ region 12 are electrically connected. Moreover, in the protective film 61, an opening portion exposing a part of the N+ region 14 of the source region S as the bottom surface is formed. In the opening portion, a contact plug 53 is embedded. Thus, the contact plug 53 and the N+ region 14 are electrically connected.

Although not illustrated, a wiring line formed on the protective film 61 is connected to each of the contact plugs 51, 52, and 53. The control gate region CG, the drain region D, and the source region S are connected to the wiring line by the contact plugs 51, 52, and 53, respectively, and a voltage of a predetermined level is applied from the wiring line.

Figure 2A:
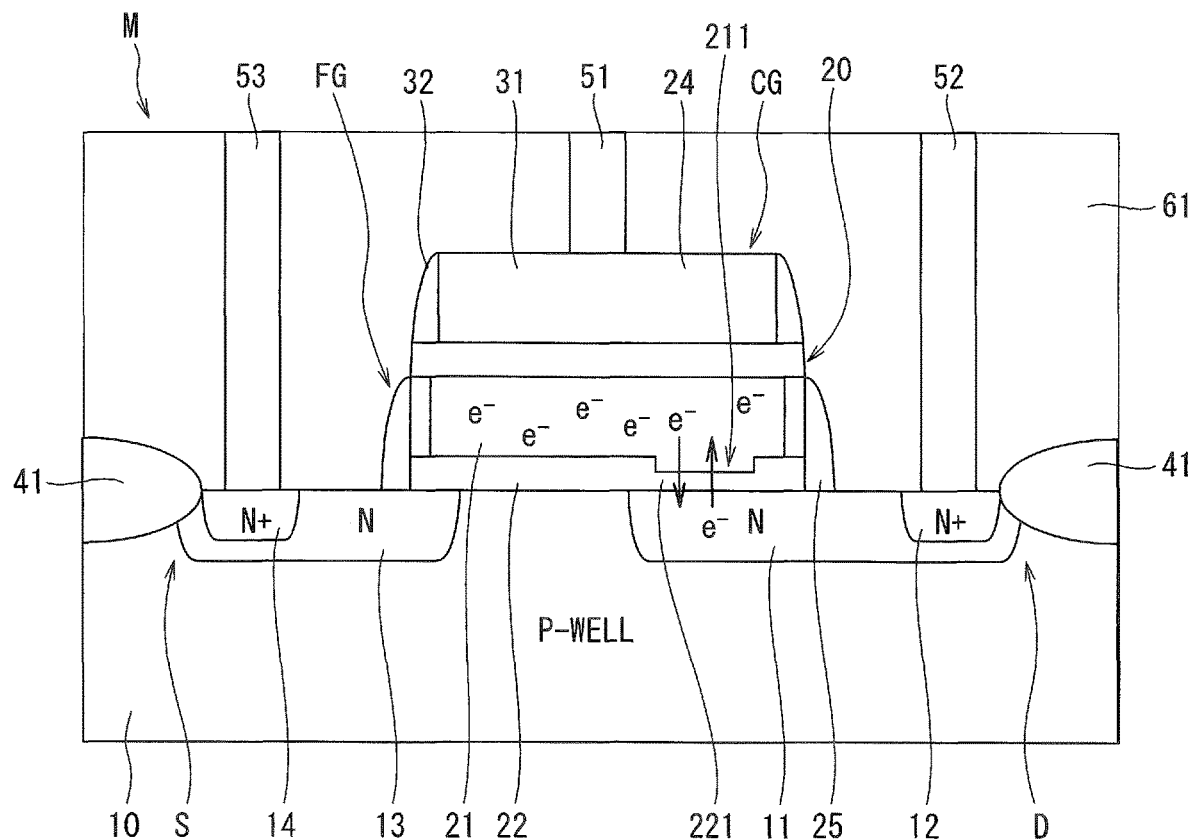
FIGS. 2A to 2C is a figure for explaining a state of charge injection and charge release of the nonvolatile storage element M provided in the temperature characteristic adjustment circuit according to the first embodiment of the present invention.
Figure 2B:
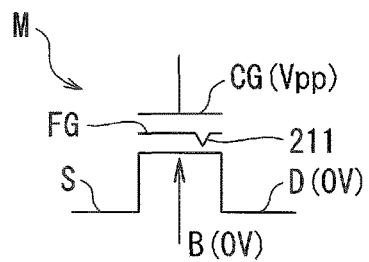
Figure 2C:
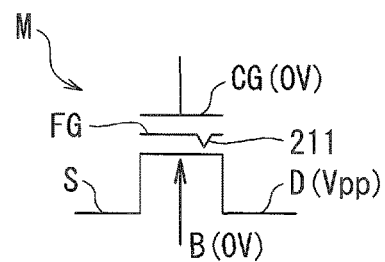

A threshold voltage Vth of the nonvolatile storage element M is controlled by the amount of charges injected into the floating gate region FG. As illustrated in FIG. 2A, electrons as the charge are injected into the floating gate region FG of the nonvolatile storage element M through the charge inlet 211. In FIG. 2A, in order to facilitate the understanding, the illustration of hatching to the cross section of each constituent component of the nonvolatile storage element M is omitted. As illustrated in FIG. 2B, when the electrons are injected into the floating gate region FG, the P-well region 10 (i.e., back gate B) and the drain region D are fixed to 0 V, and then a pulse voltage Vpp of 10 V or more is applied to the control gate region CG, for example. Thus, as indicated by the upward straight arrow in FIG. 2A, the electrons are injected into the charge holding region 21 from the drain region D through the charge inlet 211. On the other hand, as illustrated in FIG. 2C, when the electrons are released from the floating gate region FG, the control gate region CG and the P-well region 10 (i.e., back gate B) are fixed to 0 V, and then a pulse voltage Vpp of 10 V or more is applied to the drain region D, for example. Thus, as indicated by the downward straight arrow in FIG. 2A, the electrons are released from the charge holding region 21 to the drain region D through the charge inlet 211. Thus, the nonvolatile storage element M can put in/put out the charges through the charge inlet 211 by controlling the voltage to be applied to the control gate region CG, the P-well region 10, and the drain region D. Since the nonvolatile storage element M does not use the source region S for putting in/putting out the charges, the source region S may be fixed to a predetermined voltage (for example, 0 V) or may be set to a floating state.

Figure 3:
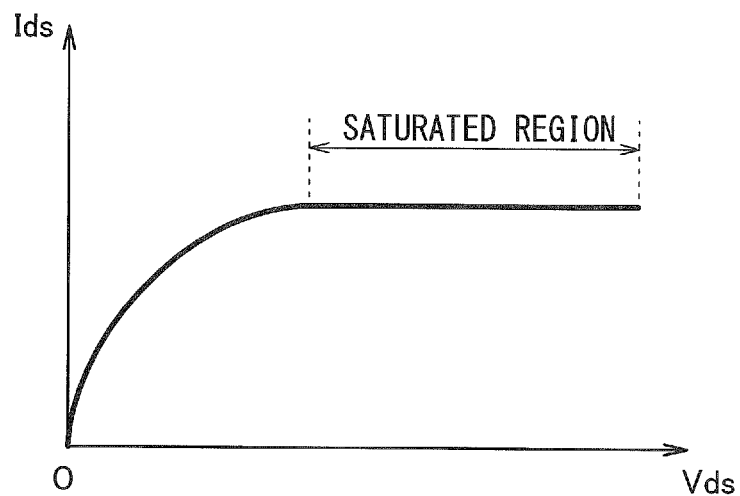
FIG. 3 is a figure for explaining the nonvolatile storage element M provided in the temperature characteristic adjustment circuit according to the first embodiment of the present invention and a conceptual diagram illustrating the characteristic of a drain-source current Ids to a drain-source voltage Vds of a field effect transistor.
Figure 4:
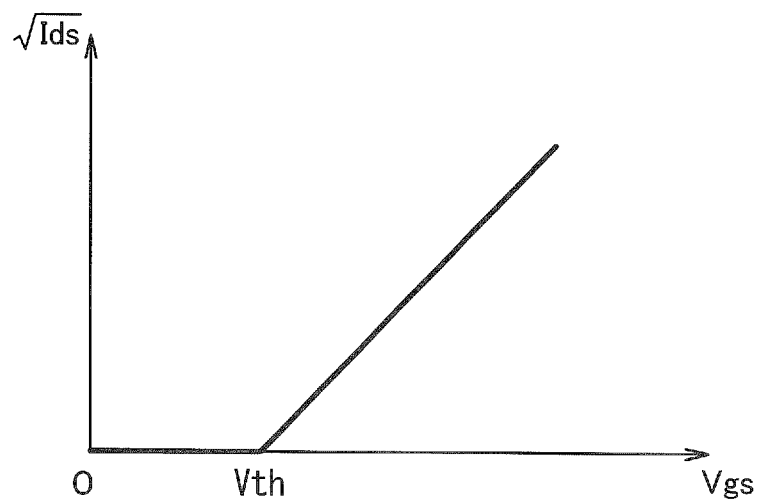
FIG. 4 is a figure for explaining the nonvolatile storage element M provided in the temperature characteristic adjustment circuit according to the first embodiment of the present invention and a conceptual diagram illustrating the characteristic of the drain-source current Ids to a gate-source voltage Vgs of the field effect transistor.
Figure 5:
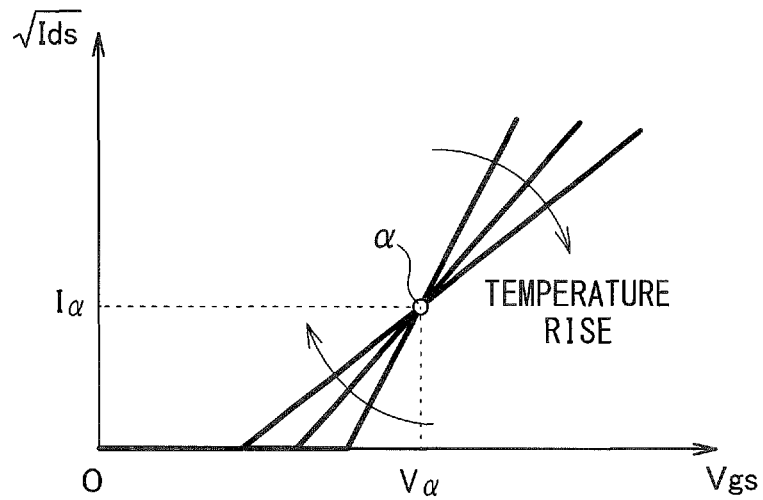
FIG. 5 is a figure for explaining the nonvolatile storage element M provided in the temperature characteristic adjustment circuit according to the first embodiment of the present invention and a conceptual diagram illustrating the temperature dependency of the drain-source current Ids of the field effect transistor.
Figure 6:
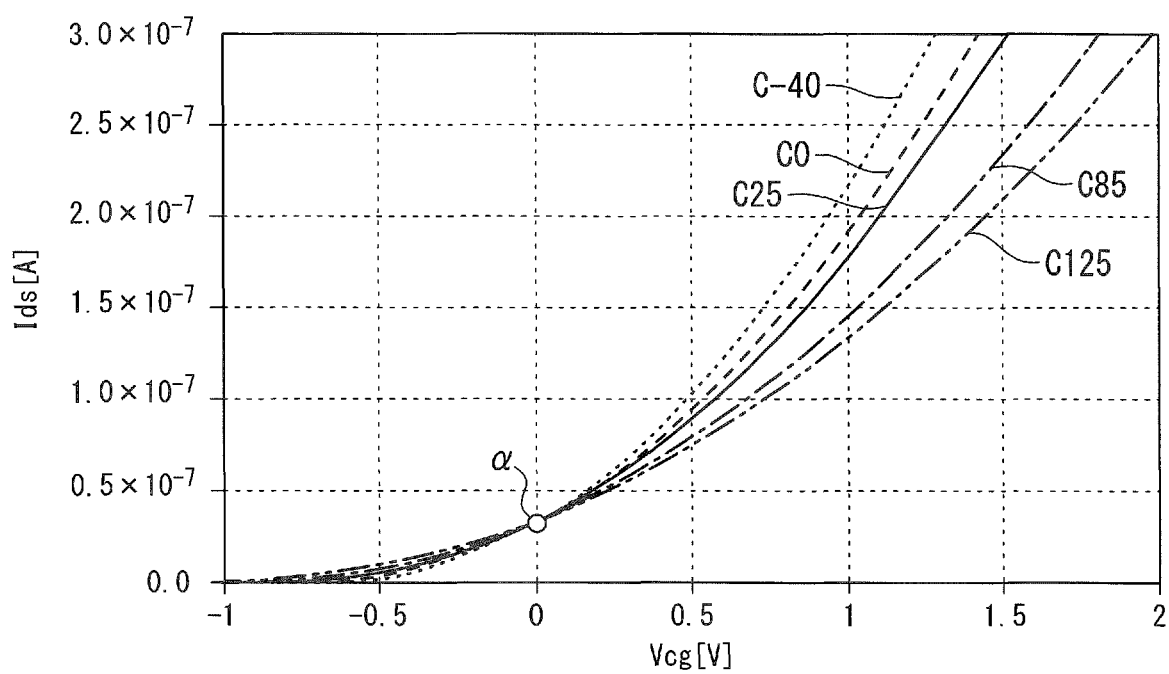
FIG. 6 is a figure explaining the nonvolatile storage element M provided in the temperature characteristic adjustment circuit according to the first embodiment of the present invention and illustrating a result of confirming a control gate voltage value Vcg and a drain current value Iα at an operating point α of the field effect transistor.

Next, the electric characteristics of the temperature characteristic adjustment circuit using the nonvolatile storage element M are described using FIGS. 3 to 11. The horizontal axis of the graph illustrated in FIG. 3 represents a drain-source voltage Vds of the field effect transistor and the vertical axis represents a drain-source current Ids of the field effect transistor. The horizontal axis of the graph illustrated in each of FIGS. 4 to 6 represents a gate-source voltage Vgs of the field effect transistor and the vertical axis represents the drain-source current Ids or the square root of the drain-source current Ids of the field effect transistor.

Since the nonvolatile storage element M is a field effect transistor, the drain-source current Ids flowing in the nonvolatile storage element M exhibits a "constant current characteristic" independent of the drain voltage (i.e., drain-source voltage Vds) in a region where a drain voltage is large referred to as a saturated region as illustrated in the conceptual diagram of FIG. 3. On the other hand, with respect to the drain-source current Ids flowing in the nonvolatile storage element M, the current amount of the drain-source current Ids flowing in the nonvolatile storage element M increases in proportion to the voltage value of the gate voltage when the gate voltage (i.e., gate-source voltage Vgs) is made larger than the threshold voltage Vth even in the saturated region as illustrated in the conceptual diagram of FIG. 4 (FIG. 4 illustrates that $\sqrt{Ids}$ is proportional to the Vgs). More specifically, the current amount of the drain-source current Ids flowing in the nonvolatile storage element M depends on only the gate voltage in the saturated region and varies depending on the magnitude (i.e., Vgs-Vth) of the gate-source voltage Vgs to the threshold voltage Vth. The drain-source current Ids in the saturated region can be expressed by the following expression (1).

[Expression 1]

$$I_{ds} \approx \frac{1}{2} \times \frac{W\mu C_{ox}}{L}(V_{gs} - V_{th})^2 \qquad (1)$$

In Expression (1), W represents the gate width, L represents the gate length, μ represents the carrier mobility, and the Cox represents the gate insulation film capacity.

Next, the temperature characteristics of the drain current of the field effect transistor are described. The threshold voltage Vth and the carrier mobility μ of the field effect transistor represented by Expression (1) can be represented by the following expression (2) and expression (3) as a function of the temperature T.

[Expression 2]

$$\mu(T) = \mu(T_r)\left(\frac{T}{T_r}\right)^{-\alpha} \quad (2)$$

[Expression 3]

$$V_{th}(T) = V_{th}(T_r) - \beta(T - T_r) \quad (3)$$

In Expression (2) and Expression (3), Tr is room temperature, α is generally a dimensionless constant of 1.2 to 2.0, and β is generally a constants of 0.5 to 3 [mV/K].

More specifically, in the field effect transistor, both the threshold voltage and the carrier mobility decrease with an increase in the temperature. Due to the fact that the threshold voltage and the carrier mobility of the field effect transistor have such temperature dependency, the drain current of the field effect transistor exhibits the temperature dependency as illustrated in the conceptual diagram of FIG. 5. Herein, due to the fact that the threshold voltage and the carrier mobility of the field effect transistor vary to the temperature in the same direction, a gate voltage value Vα of the gate-source voltage Vgs in which the drain current of the field effect transistor does not depend on the temperature is present. More specifically, the temperature characteristics are not generated in a drain current value Iα of the drain-source current Ids created by the gate voltage value Vα of the gate-source voltage Vgs not exhibiting the temperature dependency. Hereinafter, the gate-source voltage Vgs and the drain-source current Ids where the field effect transistor operates without exhibiting the temperature dependency are set as operating points α.

Herein, the current amount of the drain-source current Ids flowing when the field effect transistor is driven at the gate-source voltage Vgs having a current amount smaller than that of the drain current value Iα of the drain-source current Ids has a positive temperature characteristic. On the contrary, the current amount of the drain-source current Ids flowing when the field effect transistor is driven at the gate-source voltage Vgs having a current amount larger than that of the drain current value Iα of the drain-source current Ids has a negative temperature characteristic. The magnitude of the absolute value of the temperature characteristic becomes larger when the field effect transistor is driven with the current amount in which the drive current is away from the drain current value Iα of drain-source current Ids (i.e., voltage in which the gate-source voltage Vgs is away from Vα). In the case of the nonvolatile storage element M, the gate-source voltage Vgs described above means a control gate voltage Vcg.

Since the temperature characteristic adjustment circuit according to this embodiment is provided with the nonvolatile storage element M, the operating point α can be controlled to an arbitrary control gate voltage Vcg by injecting charges into the floating gate region FG beforehand. Therefore, at a voltage in accordance with the intended use of a circuit of which temperature characteristic is adjusted by the temperature characteristic adjustment circuit, the temperature characteristic adjustment circuit can give both positive/negative temperature characteristics.

FIG. 6 illustrates a drain current characteristic to the control gate voltage Vcg to be applied to the control gate region CG of the nonvolatile storage element M illustrated in FIG. 1 and the temperature. The horizontal axis represents the control gate voltage Vcg and the vertical axis represents the drain-source current Ids. A characteristic C-40 illustrates the drain current characteristic at −40° C., a characteristic C0 illustrates the drain current characteristic at 0° C., a characteristic C25 illustrates the drain current characteristic at 25° C., a characteristic C85 illustrates the drain current characteristic at 85° C., and a characteristic C125 illustrates the drain current characteristic at 125° C. The drain current characteristics illustrated in FIG. 6 are the characteristics in a saturated region where the drain voltage Vds is sufficiently large.

Figure 7:
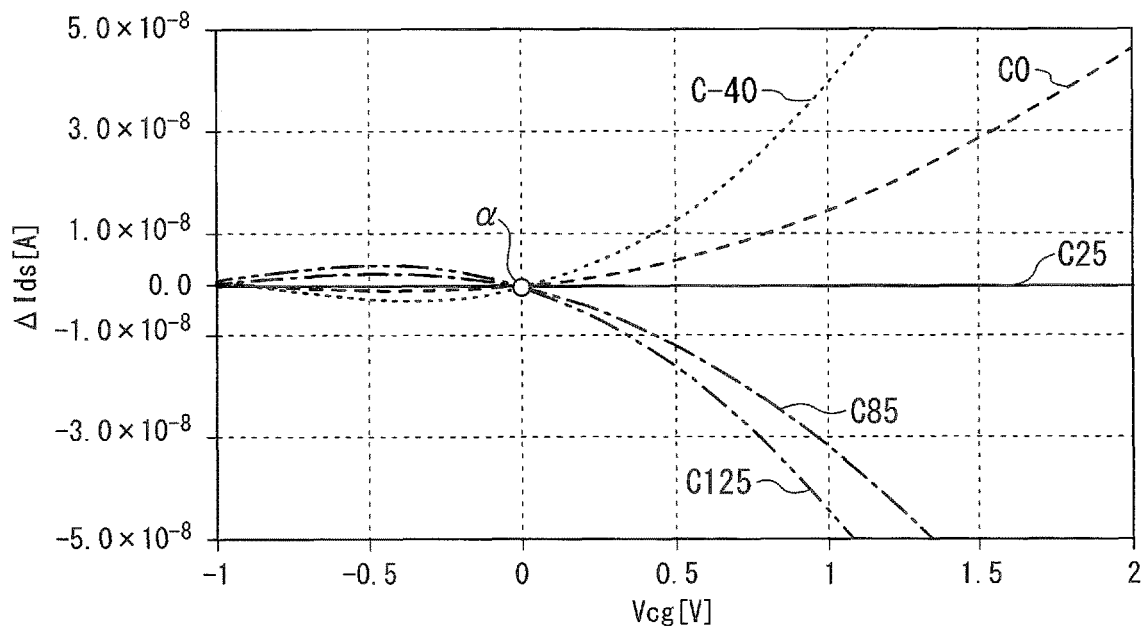
FIG. 7 is a figure explaining the nonvolatile storage element M provided in the temperature characteristic adjustment circuit according to the first embodiment of the present invention and illustrating s the drain current characteristic of the nonvolatile storage element M at each temperature by the change amount from the drain current amount at 25° C.

FIG. 7 illustrates the drain current characteristic at each temperature illustrated in FIG. 6 by the change amount from the drain current amount at 25° C. The horizontal axis represents the control gate voltage Vcg and the vertical axis represents a change amount ΔIds of the drain current. A characteristic C-40 illustrates the characteristic of the change amount of the drain current at −40° C., a characteristic C0 illustrates the characteristic of the change amount of the drain current at 0° C., a characteristic C25 illustrates the characteristic of the change amount of the drain current at 25° C., a characteristic C85 illustrates the characteristic of the change amount of the drain current at 85° C., and a characteristic C125 illustrates the characteristic of the change amount of the drain current at 125° C.

Figure 8:
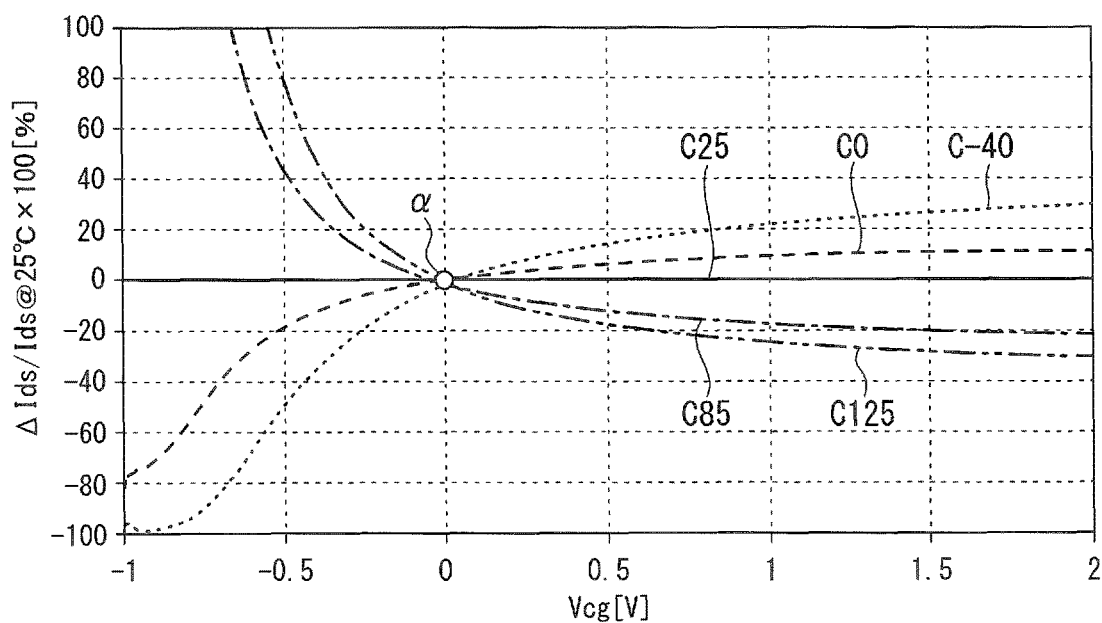
FIG. 8 is a figure explaining the nonvolatile storage element M provided in the temperature characteristic adjustment circuit according to the first embodiment of the present invention and illustrating the drain current characteristic of the nonvolatile storage element M at each temperature by the change rate from the drain current amount at 25° C.

FIG. 8 illustrates the drain current characteristic at each temperature illustrated in FIG. 6 by the change rate from the drain current amount at 25° C. The horizontal axis represents the control gate voltage Vcg and the vertical axis represents a drain current change rate ΔIds/Ids@25° C. as a percentage. The "Ids@25° C." represents the drain current amount of the drain-source current Ids at 25° C. A characteristic C-40 illustrates the characteristic of the change rate of the drain current at −40° C., a characteristic C0 illustrates the characteristic of the change rate of the drain current at 0° C., a characteristic C25 illustrates the characteristic of the change rate of the drain current at 25° C., a characteristic C85 illustrates the characteristic of the change rate of the drain current at 85° C., and a characteristic C125 illustrates the characteristic of the change rate of the drain current at 125° C. When assuming the intended use as a current source, the current change rate to the temperature becomes important. As illustrated in FIG. 8, the current change rate to the temperature at the operating point α is zero. Since the drive is gradually performed in a weak inversion region on the side where the control gate voltage Vcg is lower than that at the operating point α, the current change rate sharply increases. Therefore, when achieving a constant current source having a small temperature characteristic using a nonvolatile storage element, It is preferable not to drive in a region where the control gate voltage Vcg is much lower than that at the operating point α.

Figure 9:
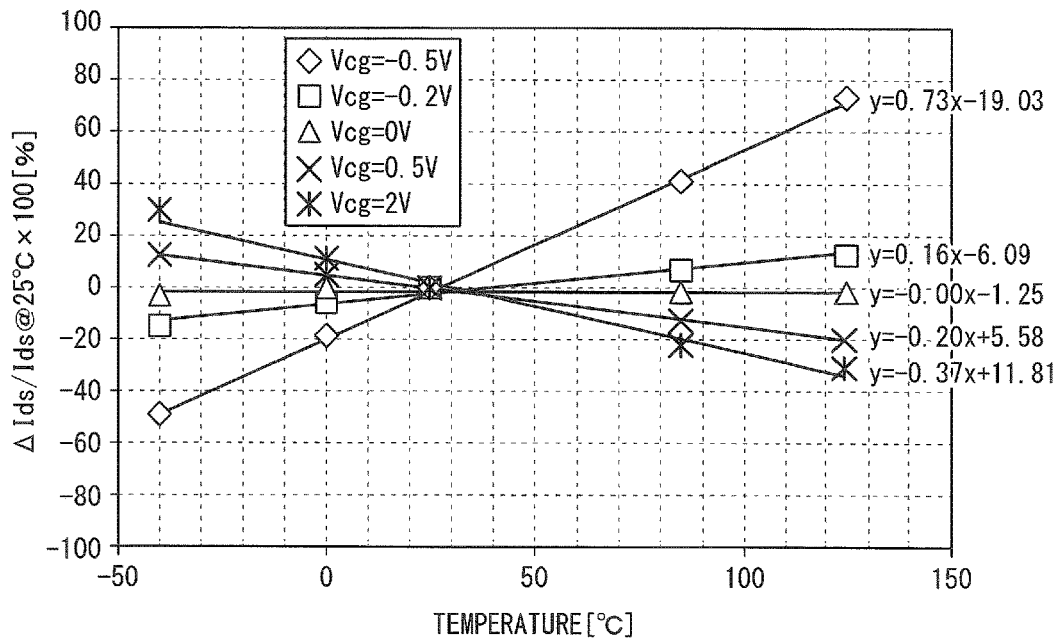
FIG. 9 is a figure for explaining the nonvolatile storage element M provided in the temperature characteristic adjustment circuit according to the first embodiment of the present invention and a graph illustrating the drain current change rates at the representative values of the control gate voltage Vcg to the temperature.

FIG. 9 is a graph illustrating the drain current change rates (vertical axis value of FIG. 8) at representative values (−0.5 V, −0.2 V, 0 V, 0.5 V, and 2 V) of the control gate voltage Vcg illustrated in FIG. 8 to the temperature. The horizontal axis represents the temperature and the vertical axis represents the drain current change rate ΔIds/Ids@25° C. as a percentage. The straight line connecting the ◇ marks illustrated in FIG. 9 illustrates the characteristic of the drain current change rate at the control gate voltage Vcg of −0.5 V, the straight line connecting the ☐ marks illustrates the characteristic of the drain current change rate at the control gate voltage Vcg of −0.2 V, the straight line connecting the Δ marks illustrates the characteristic of the drain current change rate at the control gate voltage Vcg of 0 V, the straight line connecting the X marks illustrates the characteristic of the drain current change rate at the control gate voltage Vcg of 0.5 V, and the straight line connecting the * marks illustrates the characteristic of the drain current change rate at the control gate voltage Vcg of 2.0 V. The expressions on the right side in FIG. 9 are expressions of the approximation straight lines of the characteristics. In the expressions, "x" represents the temperature of the horizontal axis and "y" represents the drain current change rate of the vertical axis.

As is understood from FIG. 9, in a region from −40° C. to 125° C., the drain current change rate ΔIds/Ids@25° C. can be considered to vary to the temperature according to a linear function. Hereinafter, the inclination when the variation of the drain current change rate ΔIds/Ids@25° C. to the temperature is expressed by a linear function is referred to as a temperature coefficient (unit: %/° C.). When the characteristics illustrated in FIG. 9 are taken as an example, the temperature coefficient at the control gate voltage Vcg of −0.5 V is 0.73 (%/° C.), the temperature coefficient at the control gate voltage Vcg of −0.2 V is 0.16 (%/° C.), the temperature coefficient at the control gate voltage Vcg of 0 V is 0.00 (%/° C.), the temperature coefficient at the control gate voltage Vcg of 0.5 V is −0.20 (%/° C.), and the temperature coefficient at the control gate voltage Vcg of 2.0 V is −0.37 (%/° C.).

Figure 10:
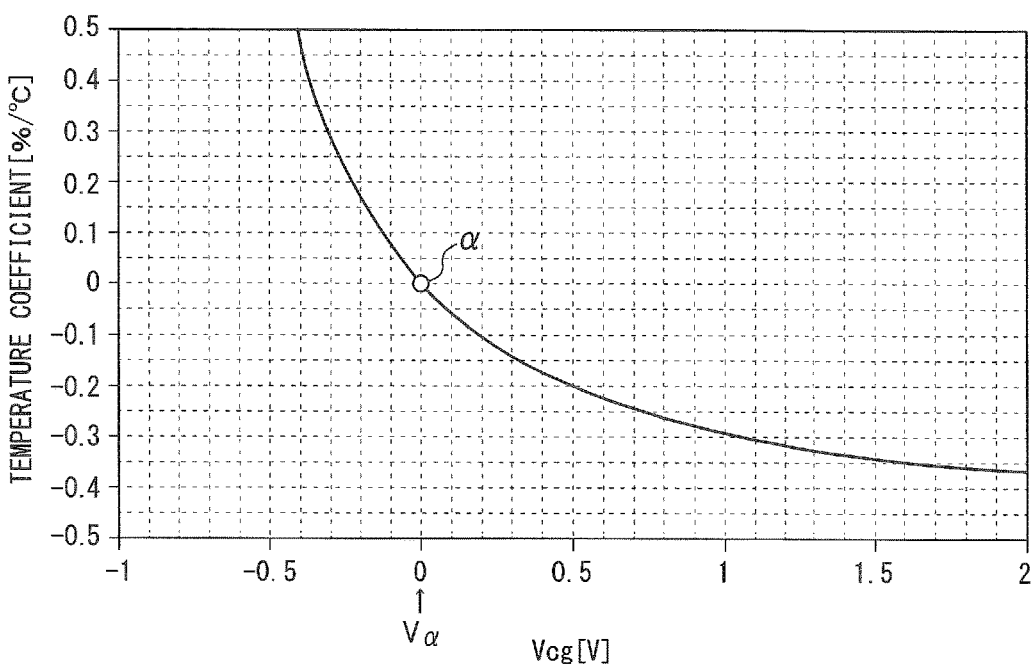
FIG. 10 is a figure for explaining the nonvolatile storage element M provided in the temperature characteristic adjustment circuit according to the first embodiment of the present invention and a graph illustrating the temperature coefficient of the drain current at the control gate voltage Vcg.

FIG. 10 is a graph illustrating the temperature coefficient of the drain current at each control gate voltage Vcg. The horizontal axis represents the control gate voltage Vcg and the vertical axis represents the temperature coefficient. The gate voltage value Vα at the operating point α of the nonvolatile storage element M is 0 V. The drain current value Iα of the drain-source current Ids of the nonvolatile storage element M at the operating point α where the gate voltage value Vα of the control gate voltage Vcg is 0 V is about 33 nA (see FIG. 6) and is less than 100 nA.

Figure 11:
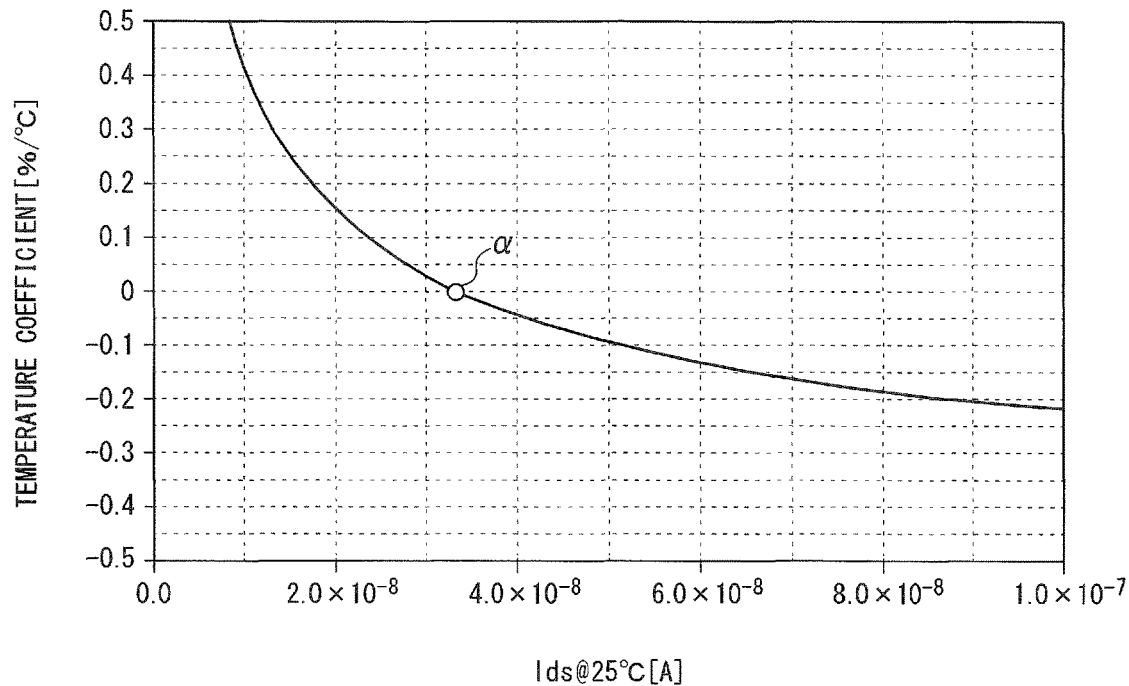
FIG. 11 is a figure for explaining the nonvolatile storage element M provided in the temperature characteristic adjustment circuit according to the first embodiment of the present invention and a graph illustrating the temperature coefficient to the drain current amount of the drain-source current Ids at 25° C.

FIG. 11 is a graph illustrating the temperature coefficient to the drain current amount of the drain-source current Ids at 25° C. The horizontal axis represents "Ids@25° C." and the vertical axis represents the temperature coefficient. More specifically, the horizontal axis of FIG. 11 represents one obtained by converting the indication of the horizontal axis (control gate voltage Vcg) of FIG. 10 into the indication of the drain-source current Ids. As illustrated in FIG. 11, when the drain current amount of the drain-source current Ids at 25° C. is smaller than the drain current amount at the operating point α, the temperature coefficient takes a positive value and, when the drain current amount of the drain-source current Ids at 25° C. is larger than the drain current amount at the operating point α, the temperature coefficient takes a negative value. The temperature coefficient monotonically decreases with an increase in the drain current amount of the drain-source current Ids at 25° C.

Figure 12:
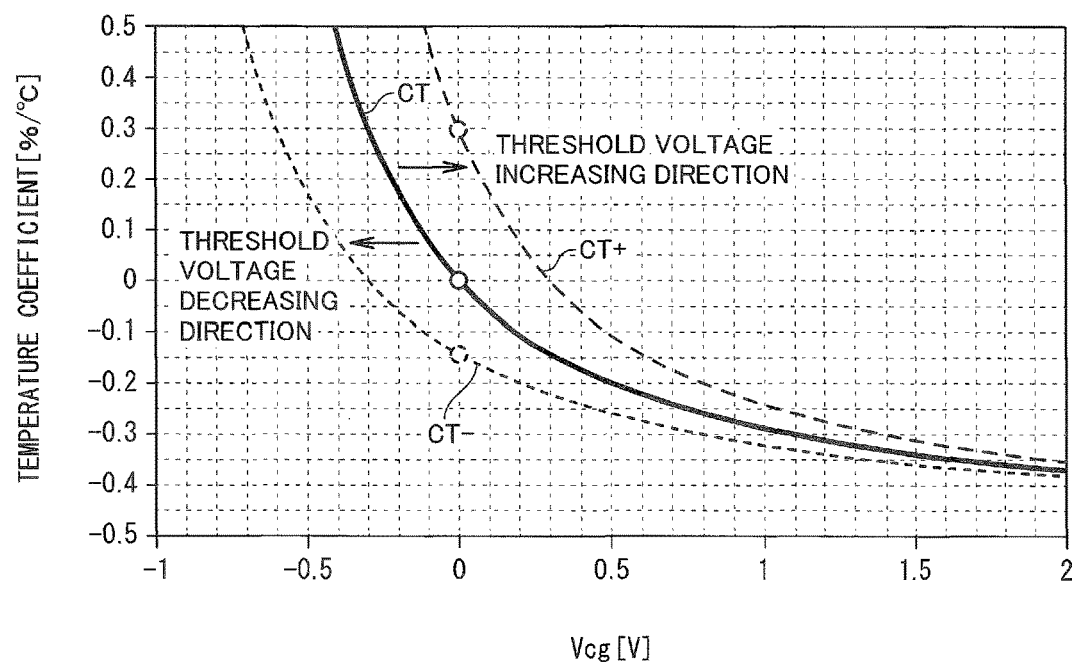
FIG. 12 is a figure for explaining the nonvolatile storage element M provided in the temperature characteristic adjustment circuit according to the first embodiment of the present invention and is the graph when the temperature characteristic of the drain-source current Ids at each control gate voltage Vcg is changed.

FIG. 12 illustrates the temperature coefficient of the drain-source current Ids at each control gate voltage Vcg and is a graph when the temperature characteristics are changed. The horizontal axis represents the control gate voltage Vcg and the vertical axis represents the temperature coefficient. A characteristic CT illustrates the characteristic (characteristic illustrated in FIG. 10) before the temperature characteristic is changed, a characteristic CT+ illustrates the case where the temperature characteristic is slightly shifted in the positive direction, and a characteristic CT− illustrates the case where the temperature characteristic is slightly shifted in the negative direction.

For example, when a positive temperature characteristic is desired to be given to the amount of current flowing in a circuit performing the drive at the control gate voltage Vcg of 0 V, charges are injected into the floating gate region in a direction where the threshold voltage of the nonvolatile storage element M increases as illustrated by the characteristic CT+ in FIG. 12. On the contrary, when a negative temperature characteristic is desired to be given to the amount of current flowing in a circuit performing the drive at the control gate voltage Vcg of 0 V, for example, charges are injected into the floating gate region in a direction where the threshold voltage of the nonvolatile storage element M decreases as illustrated by the characteristic CT− in FIG. 12. At a voltage adjusted in accordance with the intended use of a circuit, both the positive or negative temperature characteristics can be given by adjusting the temperature characteristics as described above.

Next, a method for adjusting the current amount in the temperature characteristic adjustment circuit according to this embodiment is described. First, the temperature coefficient (data equivalent to FIG. 11) to each current value of the nonvolatile storage element M is acquired as a design parameter in advance in an arbitrary size (for example, per unit area) and at an arbitrary temperature (for example, 25° C.). Then, the current value per unit area capable of achieving a desired temperature coefficient is estimated, and then the sizes (gate length, gate width) of the nonvolatile storage element M capable of achieving the amount of a current which is desired to be caused to flow in an actual circuit are determined based on the information. Thus, the sizes of the nonvolatile storage element M capable of simultaneously achieving a desired temperature characteristics and a desired current amount are determined. Hereinafter, a current adjustment method is described using FIGS. 13 to 21 taking a temperature characteristic adjustment circuit driving the nonvolatile storage element M at the gate-source voltage Vgs of 0 V, i.e., short-circuiting the gate region and the source region, as an example.

Figure 13:
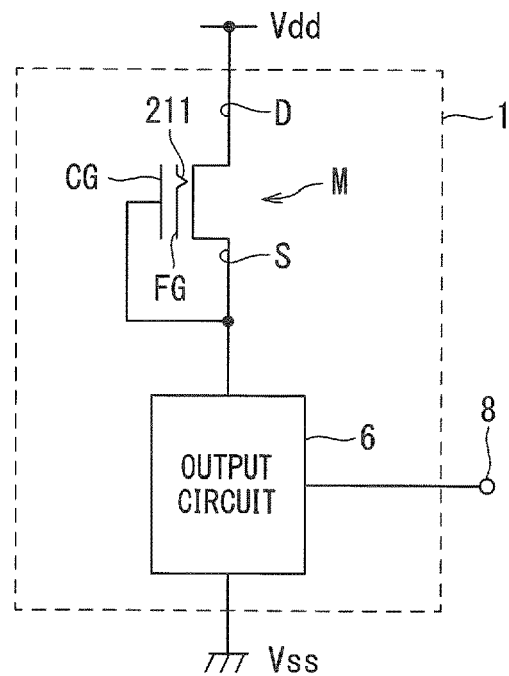
FIG. 13 is a circuit configuration diagram for explaining a temperature characteristic adjustment circuit 1 according to the first embodiment of the present invention.

As illustrated in FIG. 13, a temperature characteristic adjustment circuit 1 in this embodiment is provided with the current source having the nonvolatile storage element M having the control gate region CG and the source region S and driven by the application of a bias between the control gate region CG and the source region S and a output circuit 6 not having a nonvolatile storage element, in which the temperature dependency of an output signal originating from the temperature dependency of the current amount of a current output from the current source is adjusted by the nonvolatile storage element M. More specifically, the temperature characteristic adjustment circuit 1 is provided with at least one or more nonvolatile storage elements M. The nonvolatile storage element M is disposed between a high voltage supply terminal Vdd to which a high voltage is supplied and a low voltage supply terminal Vss to which a low voltage is supplied, for example. Hereinafter, the mark "Vdd" is also used as the mark for a high voltage output from the high voltage supply terminal Vdd. The mark "Vss" is also used as the mark for a low voltage output from the low voltage supply terminal Vss. The drain region D of the nonvolatile storage element M is connected to the high voltage supply terminal Vdd and the source region S is connected to the output circuit 6 which is a current supply destination. To the output circuit 6, an output terminal 8 from which an output voltage or an output current is output is connected. The source region S and the control gate region CG of the nonvolatile storage element M are connected to each other. The configuration illustrated in FIG. 13 is an example. The current source using the nonvolatile storage element M does not necessarily need to be disposed between the high voltage supply terminal Vdd and the output circuit 6.

Figure 14:
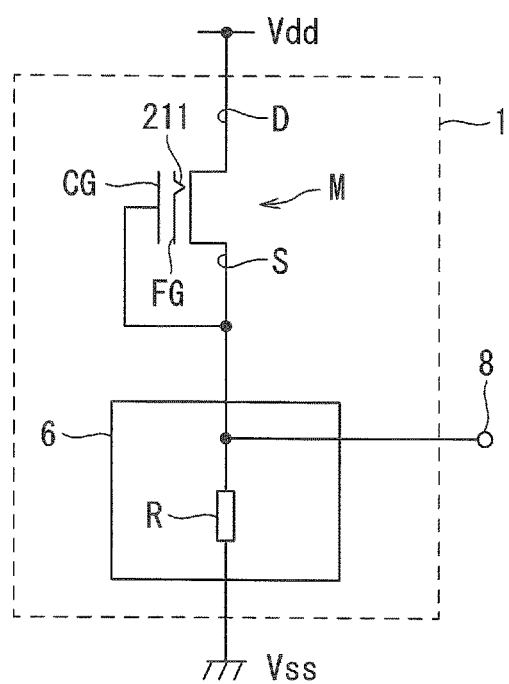
FIG. 14 is the temperature characteristic adjustment circuit 1 according to the first embodiment of the present invention and is a circuit configuration diagram for explaining the temperature characteristic adjustment circuit 1 having an output circuit 6 configured by a current voltage conversion circuit.

As the output circuit 6, a circuit outputting a voltage by a current-voltage conversion circuit or the like and a circuit outputting a current by a current mirror circuit or the like are illustrated, for example. As illustrated in FIG. 14, the output circuit 6 containing the current-voltage conversion circuit has a resistive element R, for example. One terminal of the resistive element R is connected to the source region S and the control gate region CG of the nonvolatile storage element M and the output terminal 8. The other terminal of the resistive element R is connected to the low voltage supply terminal Vss. The current-voltage conversion circuit containing the resistive elements R converts a current to be supplied from the current source having the nonvolatile storage element M into a voltage, and then outputs the converted voltage from the output terminal 8. The current source causes a current in which the temperature characteristic is adjusted to flow into the resistive element R. Therefore, the temperature characteristic adjustment circuit 1 can output a voltage in which the temperature characteristic is adjusted from the output terminal 8. Thus, the output circuit 6 outputs a voltage output signal from the output terminal 8.

Figure 15:
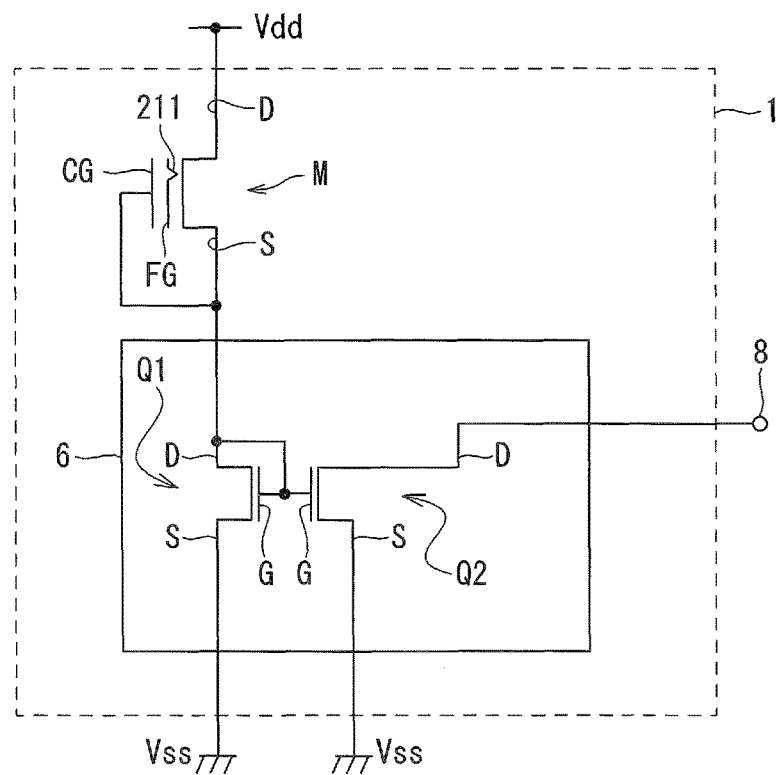
FIG. 15 is the temperature characteristic adjustment circuit 1 according to the first embodiment of the present invention and is a circuit configuration diagram for explaining the temperature characteristic adjustment circuit 1 having an output circuit 6 containing a current mirror circuit.

As illustrated in FIG. 15, the output circuit 6 containing the current mirror circuit has a transistor Q1 and a transistor Q2, gate terminals G of which are connected to each other, for example. The transistor Q1 and the transistor Q2 are N-type field effect transistors, for example. A drain terminal D of the transistor Q1 is connected to the gate terminals G of the transistors Q1 and Q2 and the source region S and the control gate region CG of the nonvolatile storage element M. A source terminal S of the transistor Q1 is connected to the low voltage supply terminal Vss. A drain terminal D of the transistor Q2 is connected to the output terminal 8. A source terminal of the transistor Q2 is connected to the low voltage supply terminal Vss. The current mirror circuit containing the two transistors Q1 and Q2 outputs a current using a current to be supplied from the current source having the nonvolatile storage element M as a reference current to the output terminal 8. The current source causes a current in which the temperature characteristic is adjusted to flow into the current mirror circuit. Therefore, the temperature characteristic adjustment circuit 1 can output a voltage in which the temperature characteristic is adjusted from the output terminal 8. Thus, the output circuit 6 outputs a current output signal from the output terminal 8.

Figure 16:
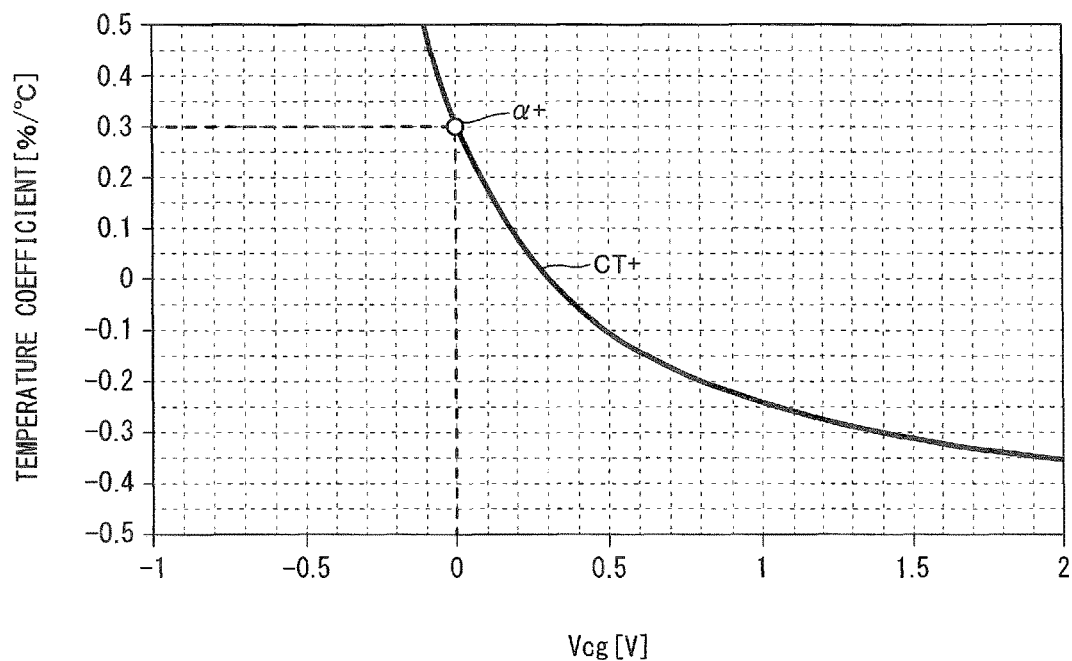
FIG. 16 is a figure for explaining the temperature characteristic adjustment circuit 1 according to the first embodiment of the present invention and illustrating only a characteristic CT+ illustrated in FIG. 12.

Next, the case where the adjustment is performed so that a current from the current source has a positive temperature characteristic is described using FIGS. 16 to 19. FIG. 16 illustrates only the characteristic CT+ illustrated in FIG. 12.

For example, it is assumed that the temperature characteristic adjustment circuit is a circuit which is desired to give a temperature characteristic to an output signal output from the output terminal 8. Moreover, in order to achieve the temperature characteristic of the output signal it is assumed that a +0.3%/° C. temperature characteristic is required for a current to be supplied to the output circuit 6 from the current source. At this time, the current source having the nonvolatile storage element M needs to be adjusted to be in the state at the operating point α+ (state where the temperature coefficient is +0.3%/° C. at the control gate voltage Vcg of 0 V) as illustrated in FIG. 16. The nonvolatile storage element M has the control gate region CG and the floating gate region FG and the nonvolatile storage element M can perform writing/erasing and can hold a writing state over a long period of time, and therefore the state at the operating point α+ can be achieved.

Figure 17:
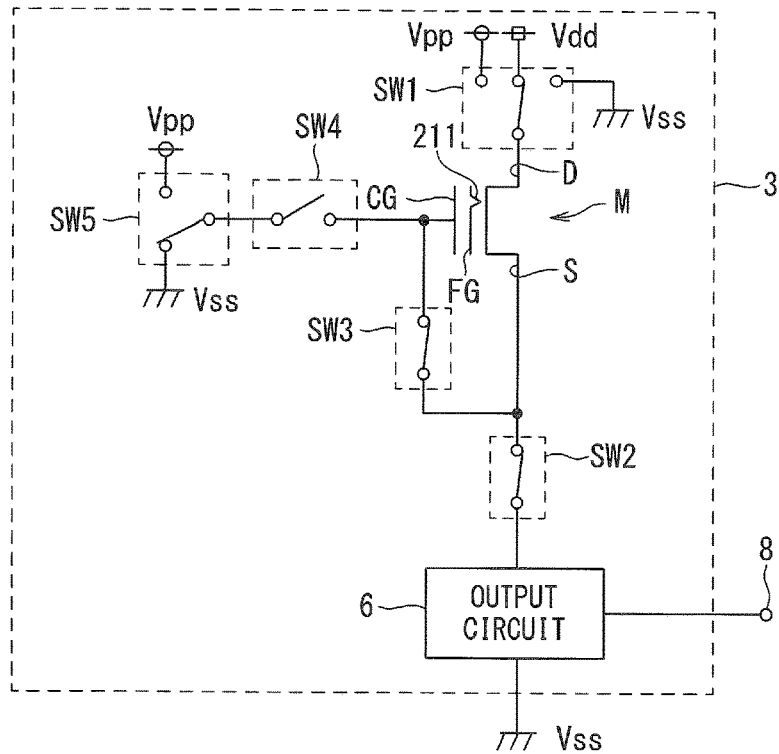
FIG. 17 is a circuit configuration diagram (No. 1) for explaining a temperature characteristic adjustment circuit 3 according to the first embodiment of the present invention.

As illustrated in FIG. 17, a temperature characteristic adjustment circuit 3 capable of performing writing in the nonvolatile storage element M is provided with a switch SW1, one terminal of which is connected to the drain region D of the nonvolatile storage element M. One of the other terminals of the switch SW1 is connected to the high voltage supply terminal Vdd, another of the other terminals of the switch SW1 is connected to the low voltage supply terminal Vss, and the other one of the other terminals of the switch SW1 is connected to an application terminal of the pulse voltage Vpp. By switching the switch SW1 as appropriate, any one of the high voltage Vdd, the low voltage Vss, and the pulse voltage Vpp can be applied to the drain region D of the nonvolatile storage element M.

The temperature characteristic adjustment circuit 3 according to this embodiment is provided with a switch SW2 connected in series between the source region S and the output circuit 6 of the nonvolatile storage element M.

The temperature characteristic adjustment circuit 3 is provided with a switch SW3 connected in series between the control gate region CG of the nonvolatile storage element M and the source region S of the nonvolatile storage element M.

The temperature characteristic adjustment circuit 3 is provided with a switch SW4, one terminal of which is connected to the control gate region CG of the nonvolatile storage element M, and a switch SW5, one terminal of which is connected to the other terminal of the switch SW4. One of the other terminals of the switch SW5 is connected to the application terminal of the pulse voltage Vpp and the other one of the other terminals of the switch SW5 is connected to the low voltage supply terminal Vss. The temperature characteristic adjustment circuit 3 can apply either one of the pulse voltage Vpp and the low voltage Vss to the control gate region CG of the nonvolatile storage element M by switching the switch SW5 as appropriate when the switch SW4 is in a connection state (short-circuit state).

As illustrated in FIG. 17, when the nonvolatile storage element M serves as the current source and supplies a current to the output circuit 6, the switches SW1 to SW5 are switched into the following states.

Switch SW1: High voltage supply terminal Vdd side
    Switch SW2: Connection state (short-circuit state)
    Switch SW3: Connection state (short-circuit state)
    Switch SW4: Open state (open-circuit state)
    Switch SW5: Arbitrary (low voltage Vss side in FIG. 17)

The temperature characteristic adjustment circuit 3 supplies a current having the +0.3%/° C. temperature characteristic to the output circuit 6 from the nonvolatile storage element M when the switch SW1 to the switch SW5 are brought into the switching state illustrated in FIG. 17 when the nonvolatile storage element M operates at the operating point α+ (see FIG. 16). More specifically, the temperature characteristic adjustment circuit 3 is provided with a switch portion including the switches SW1 to SW5 setting the potential of each terminal of the nonvolatile storage element M to a desired potential.

Figure 18:
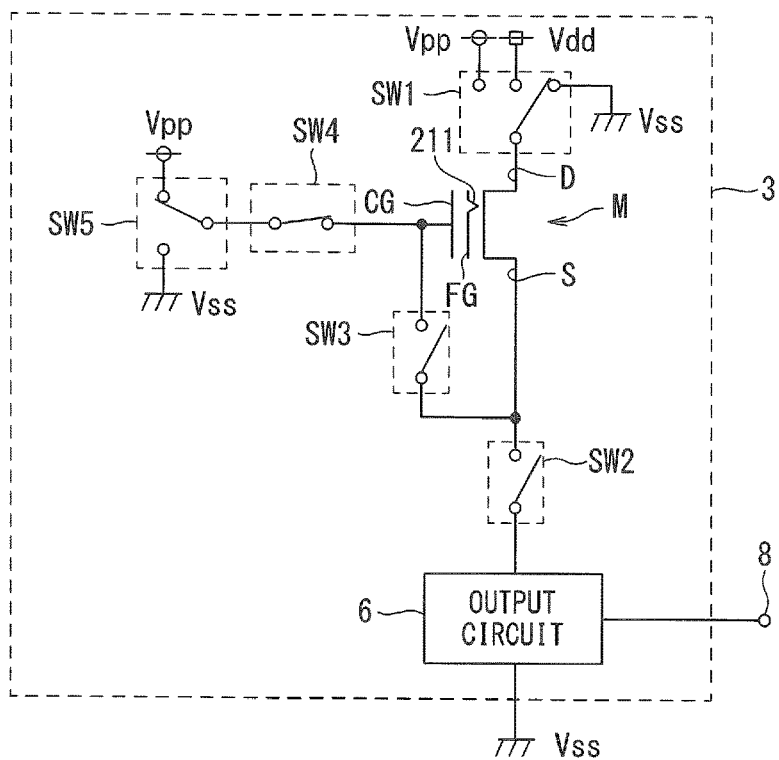
FIG. 18 is a circuit configuration diagram (No. 2) for explaining the temperature characteristic adjustment circuit 3 according to the first embodiment of the present invention.

As illustrated in FIG. 18, the temperature characteristic adjustment circuit 3 switches the switches SW1 to SW5 into the following states when performing writing for operating the nonvolatile storage element M at the operating point α+. Herein, the case where the threshold voltage before the adjustment of the nonvolatile storage element M is lower than a desired threshold voltage is taken as an example.

Switch SW1: Low voltage supply terminal Vss side
Switch SW2: Open state (open-circuit state)
Switch SW3: Open state (open-circuit state)
Switch SW4: Connection state (short-circuit state)
Switch SW5: Pulse voltage Vpp side Therefore, the low voltage Vss is applied to the drain region D of the nonvolatile storage element M and the pulse voltage Vpp is applied to the control gate region CG, and therefore electrons are injected into the floating gate region FG (charge holding region) from the drain region D through the charge inlet 211. Thus, the threshold voltage of the nonvolatile storage element M becomes high. On the contrary, when the pulse voltage Vpp is applied to the drain region D of the nonvolatile storage element M and the low voltage Vss is applied to the control gate region CG, electrons are released from the floating gate region FG (charge holding region) to the drain region D through the charge inlet 211. Thus, the threshold voltage of the nonvolatile storage element M becomes low.

Figure 19:
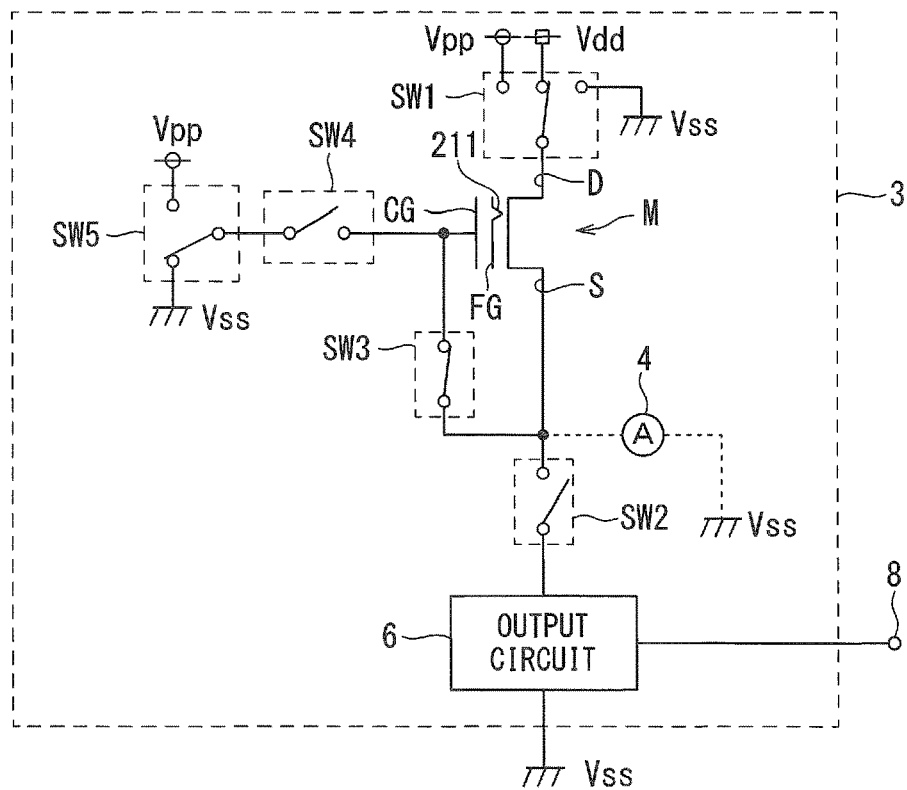
FIG. 19 is a circuit configuration diagram (No. 3) for explaining the temperature characteristic adjustment circuit 3 according to the first embodiment of the present invention.

FIG. 19 is a figure illustrating a state of confirming an actual output current of the current source (nonvolatile storage element M) illustrated in FIG. 17. In this state, the switches SW1 to SW5 are switched into the following states and an ammeter 4 is connected in series between the source region S and the low voltage Vss to confirm an output current.

Switch SW1: High voltage supply terminal Vdd side
Switch SW2: Open state (open-circuit state)
Switch SW3: Connection state (short-circuit state)
Switch SW4: Open state (open-circuit state)
Switch SW5: Arbitrary (low voltage Vss side in FIG. 19)

The writing state illustrated in FIG. 18 and the confirmation state illustrated in FIG. 19 are repeatedly carried out, and then stopped when a desired current and a desired temperature coefficient as the current source are obtained. Thus, the adjustment of the output current of the nonvolatile storage element M is completed. Thereafter, the switches SW1 to SW5 are switched into the states illustrated in FIG. 17, whereby the nonvolatile storage element M as the current source can supply a current having the +0.3%/° C. temperature characteristic to the output circuit 6.

Figure 20:
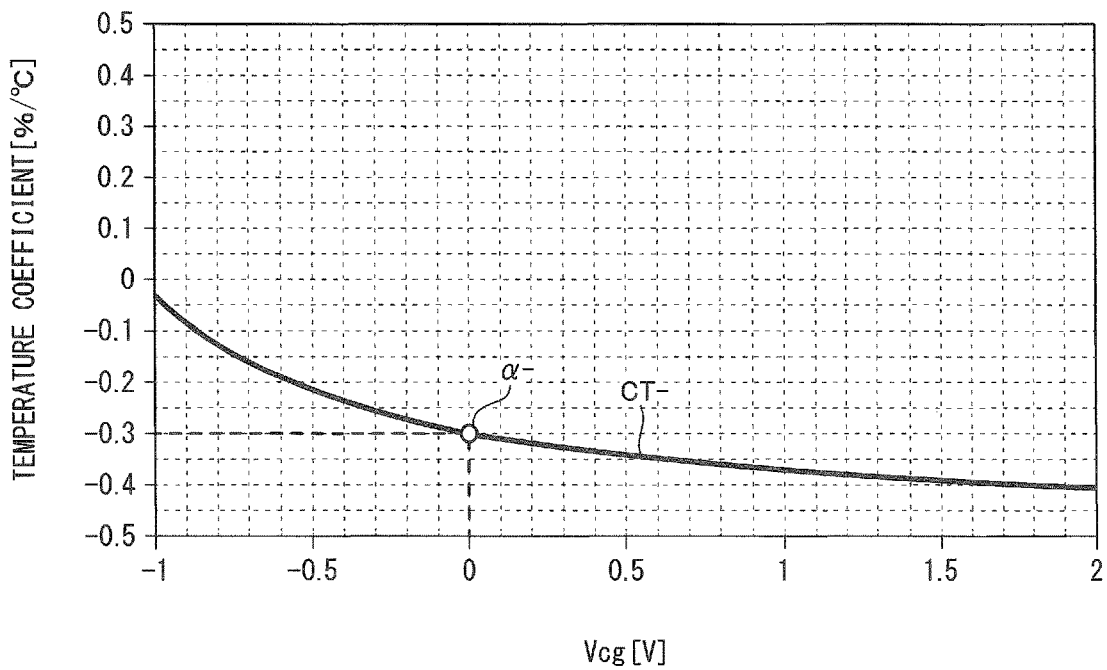
FIG. 20 is a figure for explaining the temperature characteristic adjustment circuit 1 according to the first embodiment of the present invention and illustrating only a characteristic CT− illustrated in FIG. 12.
Figure 21:
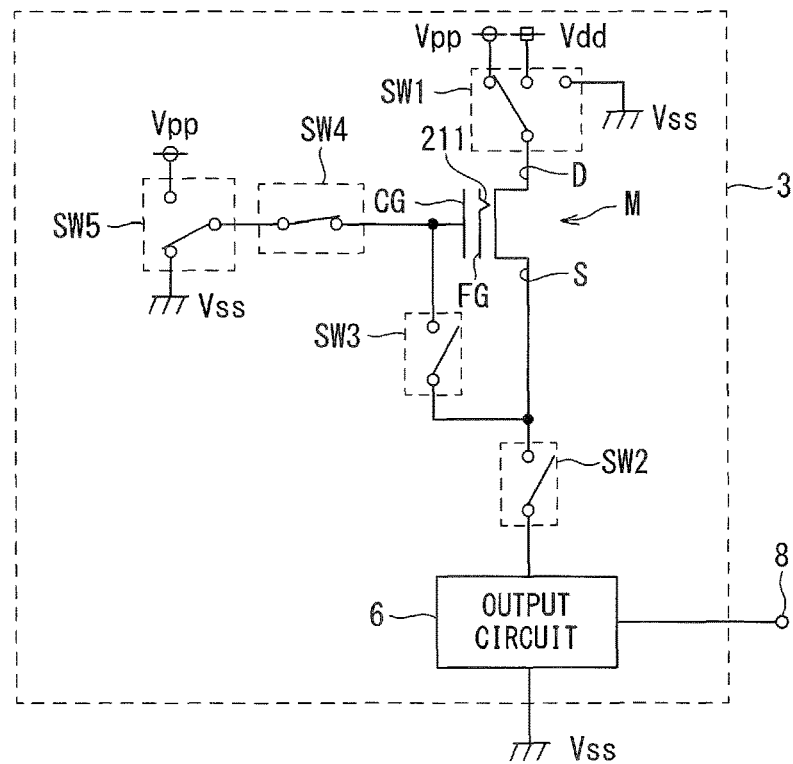
FIG. 21 is a circuit configuration diagram (No. 4) for explaining the temperature characteristic adjustment circuit 3 according to the first embodiment of the present invention.

Next, the case where the adjustment is performed so that a current from the current source has a negative temperature characteristic is described using FIGS. 20 and 21 referring to FIGS. 17 and 19. FIG. 20 illustrates a characteristic CT− corresponding to the characteristic CT− illustrated in FIG. 12 and having a temperature coefficient in which the operating point α− is −0.3%/° C.

For example, a situation is assumed where a −0.3%/° C. temperature characteristic is required for the current source in order to achieve the temperature characteristic of an output signal. At this time, the nonvolatile storage element M serving as the current source needs to be adjusted to be in the state at the operating point α− (state where the temperature coefficient is −0.3%/° C. at the control gate voltage Vcg of 0 V) as illustrated in FIG. 20. The nonvolatile storage element M has the control gate region CG and the floating gate region FG and the nonvolatile storage element M can perform writing/erasing and can hold a writing state over a long period of time, and therefore the state at the operating point α− can be achieved.

When the switches SW1 to SW5 are brought into the switching states illustrated in FIG. 17 when the nonvolatile storage element M of the temperature characteristic adjustment circuit 3 operates at the operating point α−, a current having a −0.3%/° C. temperature characteristic can be supplied to the output circuit 6 from the nonvolatile storage element M.

As illustrated in FIG. 21, the temperature characteristic adjustment circuit 3 switches the switches SW1 to SW5 into the following states when performing writing for operating the nonvolatile storage element M at the operating point α−. Herein, the case where the threshold voltage before the adjustment of the nonvolatile storage element M is higher than a desired threshold voltage is taken as an example.

Switch SW1: Pulse voltage Vpp side
Switch SW2: Open state (open-circuit state)
Switch SW3: Open state (open-circuit state)
Switch SW4: Connection state (short-circuit state)
Switch SW5: Low voltage supply terminal Vss side Therefore, the pulse voltage Vpp is applied to the drain region D of the nonvolatile storage element M and the low voltage Vss is applied to the control gate region CG, and therefore electrons are released from the floating gate region FG (charge holding region) to the drain region D through the charge inlet 211. Thus, the threshold voltage of the nonvolatile storage element M becomes low. On the contrary, when the low voltage Vss is applied to the drain region D of the nonvolatile storage element M and the pulse voltage Vpp is applied to the control gate region CG, electrons are injected into the floating gate region FG (charge holding region) from the drain region D through the charge inlet 211. Thus, the threshold voltage of the nonvolatile storage element M becomes high.

Thereafter, an output current of the nonvolatile storage element M serving as the current source is confirmed by the method described using FIG. 19. The writing state illustrated in FIG. 21 and the confirmation state illustrated in FIG. 19 are repeatedly carried out, and then stopped when a desired current and a desired temperature coefficient as the current source are obtained. Thus, the adjustment of the output current of the nonvolatile storage element M is completed. Thereafter, the switches SW1 to SW5 are switched into the states illustrated in FIG. 17, whereby the nonvolatile storage element M as the current source can supply a current having the −0.3%/° C. temperature characteristic to the output circuit 6.

As illustrated in FIGS. 17 to 21, the temperature characteristic adjustment circuit 3 can rewrite the threshold voltage of the nonvolatile storage element M to a value in which a current amount having a desired temperature characteristic is obtained, and finally output the current amount having the desired temperature characteristic to the output circuit in the state illustrated in FIG. 17 by appropriately switching the switches SW1 to SW5. As described above, this embodiment can freely control the temperature characteristic of the output obtained from the temperature characteristic adjustment circuit 3.

The temperature characteristic adjustment circuits 1 and 3 according to this embodiment can variously adjust the temperature characteristic of the output signal of the output circuit 6 to both positive and negative temperature characteristics. For a semiconductor device to be used in the current sources of the temperature characteristic adjustment circuits 1 and 3, the nonvolatile storage element M is used. Since this enables the adjustment of the current value of a current output from the current source, the temperature characteristics can be variously adjusted to both positive and negative temperature characteristics with an excessively small characteristic variation and an increase in the chip area and the current consumption can be suppressed with a simple circuit configuration.

Moreover, the temperature characteristic adjustment circuits 1 and 3 according to this embodiment are circuits which are provided with the current source and the output circuit and in which an output signal of the output circuit has temperature dependency and are circuits in which the temperature dependency of the output signal originates from the temperature dependency of the amount of a current flowing through the inside of the circuit. The temperature characteristic adjustment circuits 1 and 3 can freely control the temperature characteristic of an output signal output from the output circuit 6 by using the nonvolatile storage element M as the current source. Moreover, the temperature characteristic adjustment circuits 1 and 3 according to this embodiment can be configured by a very simple circuit, and therefore the circuit scale or a current consumed in the circuit can be minimized.

Second Embodiment

Figure 22:
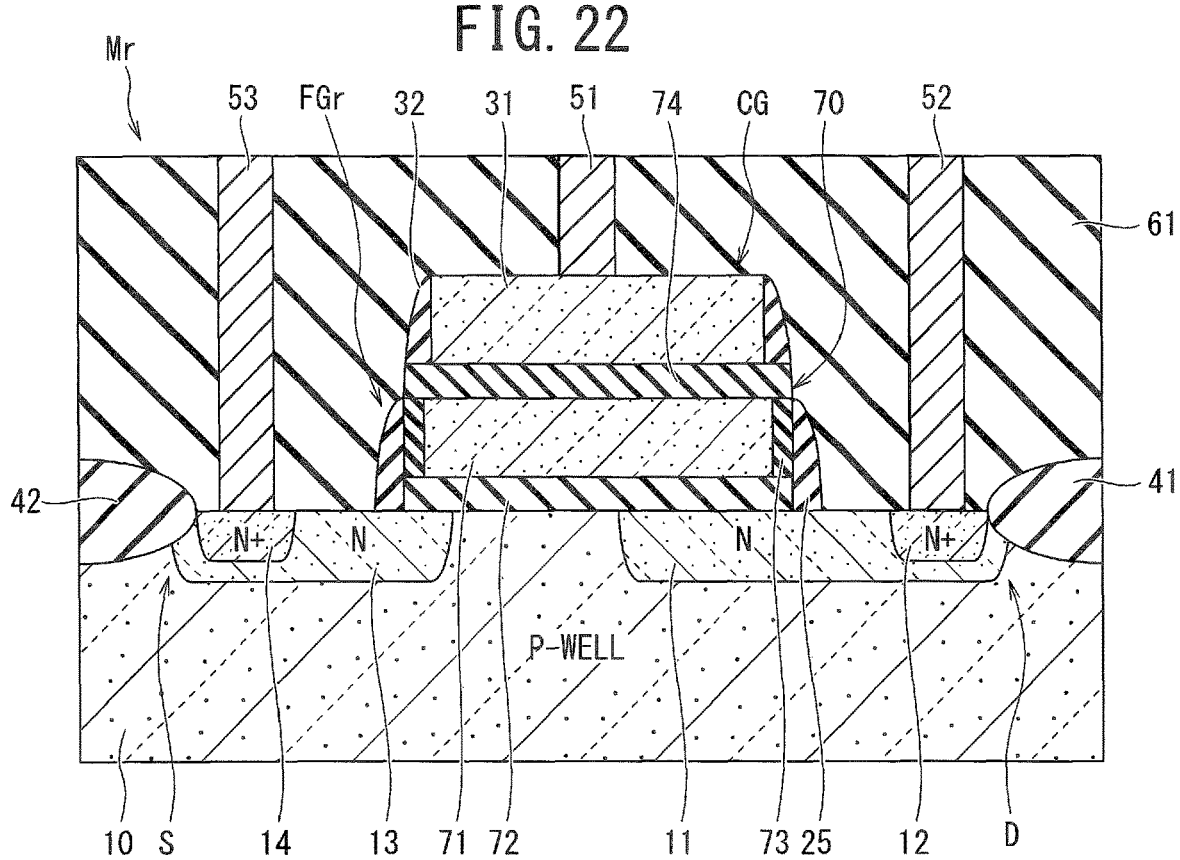
FIG. 22 is a figure for explaining a nonvolatile storage element M according to a second embodiment of the present invention and a cross-sectional view illustrating the schematic configuration of a nonvolatile storage element Mr not having a charge inlet.

A temperature characteristic adjustment circuit according to a second embodiment of the present invention is described using FIGS. 22 to 27. A nonvolatile storage element according to this embodiment has a configuration in which a nonvolatile storage element Mw having the same structure as that of the nonvolatile storage element M illustrated in FIG. 1 and a nonvolatile storage element Mr illustrated in FIG. 22 are contained as one set, floating gate regions of the nonvolatile storage element Mw and the nonvolatile storage element Mr are connected, and control gate regions of the nonvolatile storage element Mw and the nonvolatile storage element Mr are connected.

As illustrated in FIG. 22, the nonvolatile storage element Mr has the same configuration as that of the nonvolatile storage element Mw except that no charge inlet is provided. The nonvolatile storage element Mr is provided with a charge holding region 71 and an insulator 70 disposed surrounding the charge holding region 71. The insulator 70 has an upper insulation film 74 formed above the charge holding region 71, a lateral wall oxide film 73 formed on the lateral wall of the charge holding region 71, and a gate insulation film 72 formed under the charge holding region 71. No tunnel insulation film is formed in the gate insulation film 72 and the film thickness is substantially constant.

Figure 23:
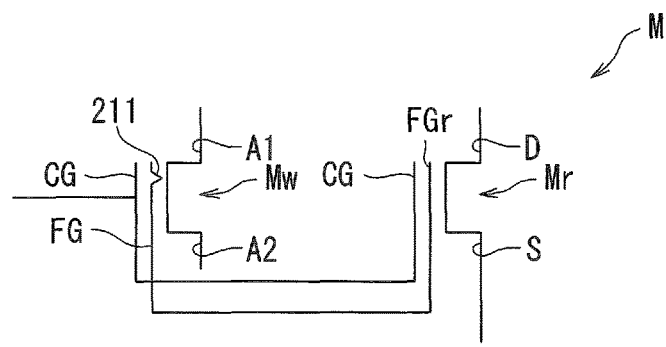
FIG. 23 is a circuit configuration diagram of the nonvolatile storage element M according to the second embodiment of the present invention.

As illustrated in FIG. 23, the nonvolatile storage element M according to this embodiment is provided with the nonvolatile storage element Mw having the same structure as that of the nonvolatile storage element M illustrated in FIG. 1 and the nonvolatile storage element Mr illustrated in FIG. 22. The control gate region CG of the nonvolatile storage element Mw and the control gate region CG of the nonvolatile storage element Mr are connected. The floating gate region FG of the nonvolatile storage element Mw and the floating gate region FG of the nonvolatile storage element Mr are connected.

Figure 24:
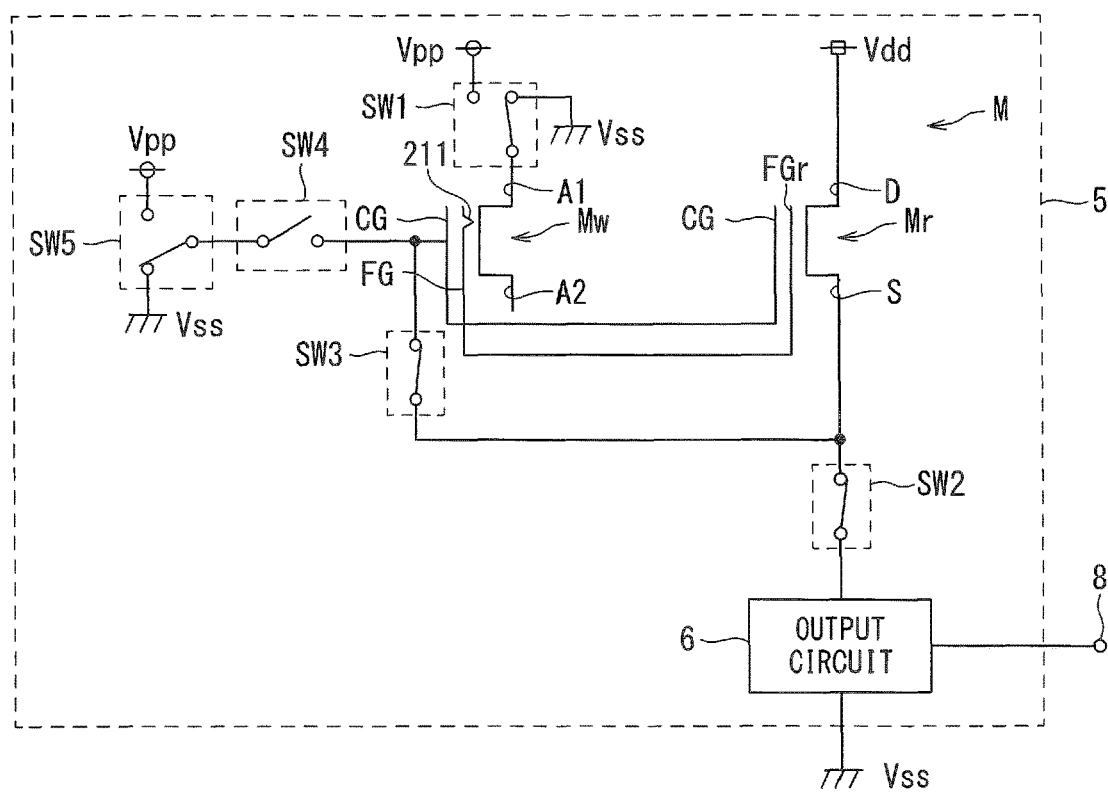
FIG. 24 is a circuit configuration diagram (No. 1) for explaining a temperature characteristic adjustment circuit 5 according to the second embodiment of the present invention.

As illustrated in FIG. 24, a temperature characteristic adjustment circuit 5 according to this embodiment is provided with at least one or more nonvolatile storage elements M. The nonvolatile storage element M has the same configuration as that of the nonvolatile storage element M illustrated in FIG. 23. The nonvolatile storage element M is provided with the nonvolatile storage elements Mw and Mr. The nonvolatile storage element Mw has the same configuration as that of the nonvolatile storage element M illustrated in FIG. 1 and the nonvolatile storage element Mr has the same configuration as that of the nonvolatile storage element Mr illustrated in FIG. 22. Therefore, hereinafter, FIG. 1 is referred to in the description of the configuration of the nonvolatile storage element Mw and FIG. 22 is referred to in the description of the configuration of the nonvolatile storage element Mr as necessary.

The temperature characteristic adjustment circuit 5 is provided with the nonvolatile storage element (example of a first nonvolatile storage element) Mw and the nonvolatile storage element (example of a second nonvolatile storage element) Mr. The nonvolatile storage element Mr has a control gate region (example of a second control gate region) CG electrically connected to a control gate region (example of a first control gate region) CG provided in the gate region of the nonvolatile storage element Mw. Moreover, the nonvolatile storage element Mr has a charge holding region (example of a second charge holding region, see FIG. 22) electrically connected to a charge holding region (example of a first charge holding region, see FIG. 1) of the nonvolatile storage element Mw and a gate insulation film (see FIG. 22) formed in contact with the charge holding region. The charge inlet 211 (see FIG. 1) provided in the nonvolatile storage element Mw is formed in a region not contacting a current path to be formed in the nonvolatile storage element Mr. The charge inlet provided in the nonvolatile storage element Mw is formed in a region not contacting the current path including the drain region D and the source region S of the nonvolatile storage element Mr. In this embodiment, the nonvolatile storage elements Mw and Mr are used as the current source. The path of a current output from the current source serves as the current path including the drain region D and the source region S of the nonvolatile storage element Mr. Therefore, the charge inlet 211 provided in the nonvolatile storage element Mw is formed in a region not contacting the path of the current output from the current source.

The control gate region CG of the nonvolatile storage element Mw and the control gate region CG of the nonvolatile storage element Mr provided in the nonvolatile storage element M are connected. The floating gate region FG of the nonvolatile storage element Mw and the floating gate region FG of the nonvolatile storage element Mr are connected.

The nonvolatile storage element Mr is disposed between a high voltage supply terminal Vdd to which a high voltage is supplied and a low voltage supply terminal Vss to which a low voltage is supplied, for example. More specifically, the drain region D of the nonvolatile storage element Mr is connected to the high voltage supply terminal Vdd and the source region S is connected to the output circuit 6 which is a current supply destination. The source region S and the control gate region CG of the nonvolatile storage element Mr are connected to each other.

The nonvolatile storage element Mw has a first region A1 provided in one of both sides of a lower portion of the floating gate region FG and a second region A2 provided in the other one of both the sides. The temperature characteristic adjustment circuit 5 in this embodiment is provided with a switch SW1, one terminal of which is connected to the first region A1 of the nonvolatile storage element Mw. One of the other terminals of the switch SW1 is connected to the low voltage supply terminal Vss and the other one of the other terminals of the switch SW1 is connected to an application terminal of the pulse voltage Vpp. The temperature characteristic adjustment circuit 5 can apply either one of the low voltage Vss and the pulse voltage Vpp to the first region A1 of the nonvolatile storage element Mw by switching the switch SW1 as appropriate.

The temperature characteristic adjustment circuit 5 is provided with a switch SW2 connected in series between the source region S and the output circuit 6 of the nonvolatile storage element Mr.

The temperature characteristic adjustment circuit 5 is provided with a switch SW3 connected in series between the control gate region CG of the nonvolatile storage element Mw and the source region S of the nonvolatile storage element Mr.

The temperature characteristic adjustment circuit 5 is provided with a switch SW4, one terminal of which is connected to the control gate region CG of the nonvolatile storage element Mw, and a switch SW5, one terminal of which is connected to the other terminal of the switch SW4. One of the other terminals of the switch SW5 is connected to the application terminal of the pulse voltage Vpp and the other one of the other terminals of the switch SW5 is connected to the low voltage supply terminal Vss. The temperature characteristic adjustment circuit 5 can apply either one of the pulse voltage Vpp and the low voltage Vss to the control gate region CG of the nonvolatile storage element M by switching the switch SW5 as appropriate when the switch SW4 is in a connection state (short-circuit state).

The second region A2 of the nonvolatile storage element Mw is not connected unlike the source region S of the nonvolatile storage element M in the current source and is in a floating state. The nonvolatile storage element Mw is a region which is present for injecting charges into the floating gate region FG of the nonvolatile storage element Mr and does not cause a current to flow as a transistor. Therefore, the nonvolatile storage element Mw does not need to have the source region S and the drain region D. The form thereof is not limited insofar as it is structured to have the charge inlet 211.

As illustrated in FIG. 24, in the temperature characteristic adjustment circuit 5, charges are injected into the floating gate region FG through the nonvolatile storage element Mw in charge injection. When the temperature characteristic adjustment circuit 5 is operated, a current flows through the nonvolatile storage element Mr. In the temperature characteristic adjustment circuit 5, the nonvolatile storage element M (i.e., nonvolatile storage elements Mw and Mr) serves as a current source having a desired temperature characteristic and capable of supplying a desired current amount as with the first embodiment.

As illustrated in FIG. 24, when the temperature characteristic adjustment circuit 5 supplies a current to the output circuit 6, the switches SW1 to SW5 are switched into the following states.

Switch SW1: Low voltage supply terminal Vss side
Switch SW2: Connection state (short-circuit state)
Switch SW3: Connection state (short-circuit state)
Switch SW4: Open state (open-circuit state)
Switch SW5: Arbitrary (low voltage Vss side in FIG. 24)

In this embodiment, when the switches SW1 to SW5 are in the switching states illustrated in FIG. 24 when the nonvolatile storage element M is the current source having a desired temperature characteristic and capable of supplying a desired current amount, a current having a desired temperature characteristic is supplied to the output circuit 6 from the nonvolatile storage element M.

Figure 25:
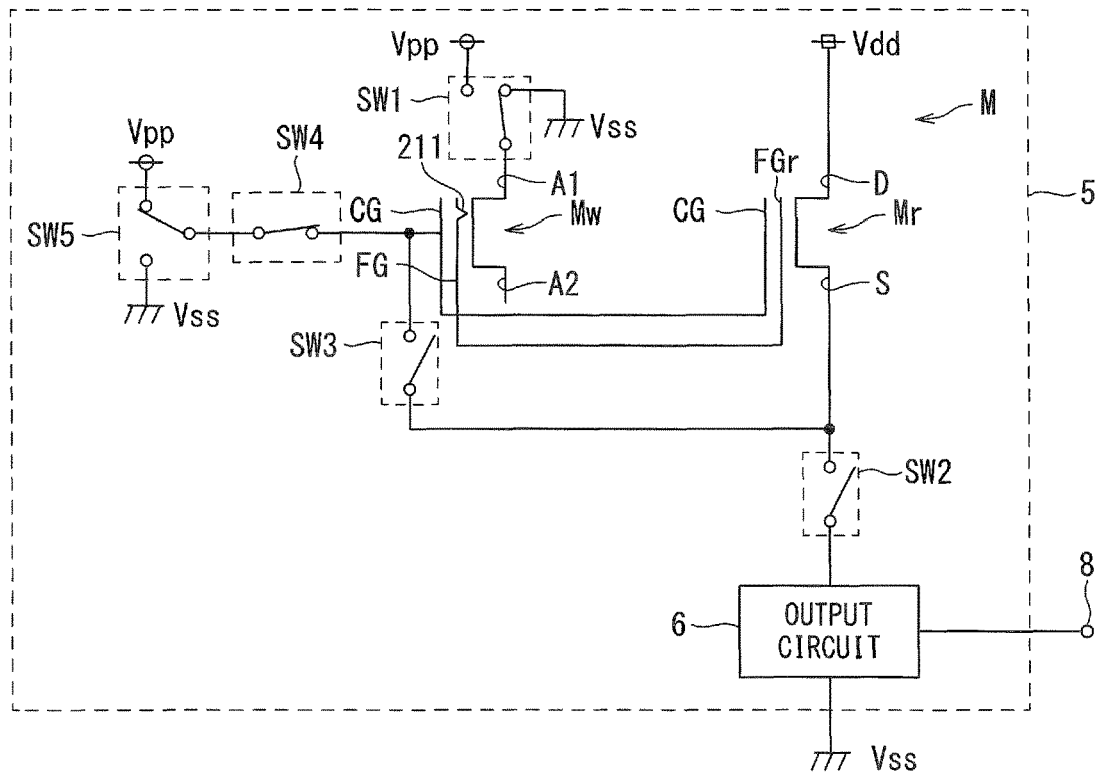
FIG. 25 is a circuit configuration diagram (No. 2) for explaining the temperature characteristic adjustment circuit 5 according to the second embodiment of the present invention.
Figure 26:
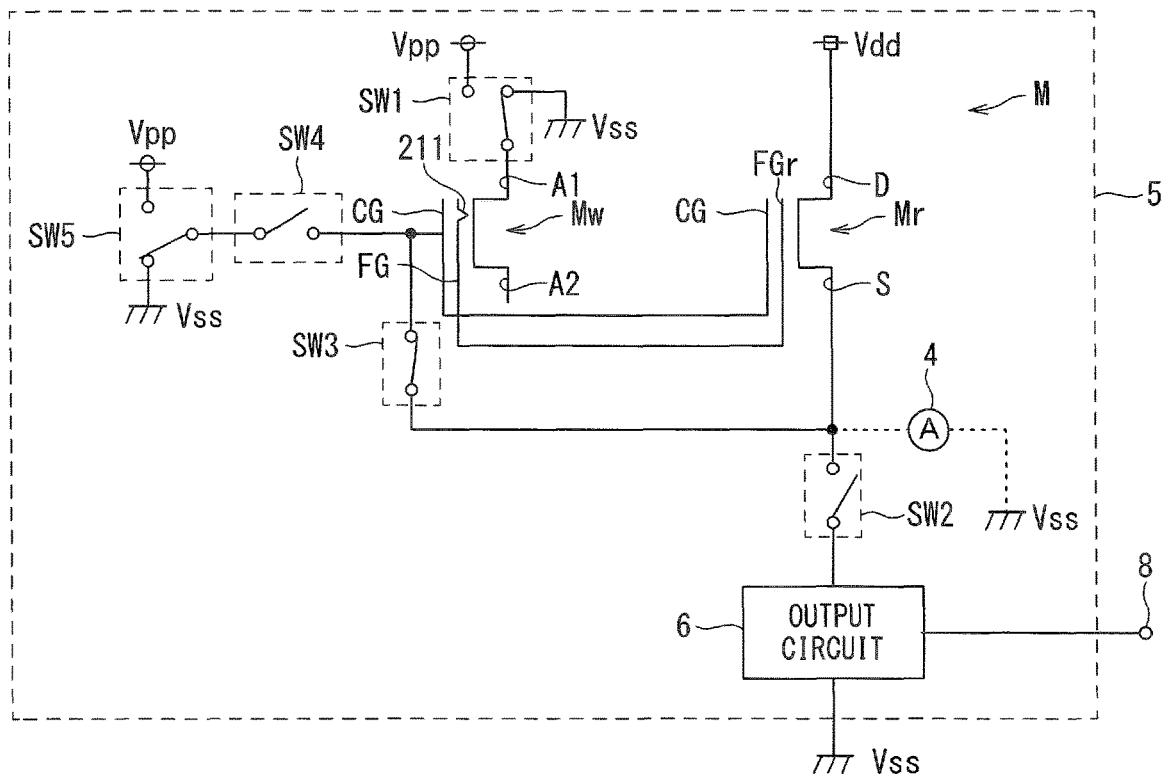
FIG. 26 is a circuit configuration diagram (No. 3) for explaining the temperature characteristic adjustment circuit 5 according to the second embodiment of the present invention.

Next, the case where the adjustment is performed so that a current from the current source has a positive temperature characteristic is described using FIGS. 25 and 26 referring to FIGS. 16 and 24.

As with the first embodiment, it is assumed that the temperature characteristic adjustment circuit 5 is a circuit which is desired to give a temperature characteristic to an output signal output from the output terminal 8 and in order to achieve the temperature characteristic of the output signal it is assumed that a +0.3%/° C. temperature characteristic is required for a current to be supplied to the output circuit 6 from a current source, for example. At this time, the nonvolatile storage element Mr serving as the current source needs to be adjusted so that the operating point is the operating point α+ (operating point where the temperature coefficient is +0.3%/° C. at the control gate voltage Vcg of 0 V) as illustrated in FIG. 16.

As illustrated in FIG. 25, the temperature characteristic adjustment circuit 5 switches the switches SW1 to SW5 into the following states when performing rewriting for operating the nonvolatile storage element M at the operating point α+. Herein, the case where the threshold voltage before the adjustment of the nonvolatile storage element M is lower than a desired threshold voltage is taken as an example.

Switch SW1: Low voltage supply terminal Vss side
Switch SW2: Open state (open-circuit state)
Switch SW3: Open state (open-circuit state)
Switch SW4: Connection state (short-circuit state)
Switch SW5: Pulse voltage Vpp side Therefore, the low voltage Vss is applied to the first region A1 of the nonvolatile storage element Mw and the pulse voltage Vpp is applied to the control gate region CG, and therefore electrons are injected into the floating gate region FG (charge holding region) from the first region A1 through the charge inlet 211. Thus, the threshold voltage of the nonvolatile storage element Mw becomes high. On the contrary, when the pulse voltage Vpp is applied to the first region A1 of the nonvolatile storage element Mw and the low voltage Vss is applied to the control gate region CG, electrons are released from the floating gate region FG (charge holding region) to the first region A1 through the charge inlet 211. Thus, the threshold voltage of the nonvolatile storage element Mw becomes low.

FIG. 26 is a figure illustrating a state of confirming an actual output current of the current source (nonvolatile storage element M) illustrated in FIG. 24. In this state, the switches SW1 to SW5 are switched into the following states and an ammeter 4 is connected in series between the source region S and the low voltage Vss of the nonvolatile storage element Mr to confirm an output current.

Switch SW1: Low voltage supply terminal Vss side
Switch SW2: Open state (open-circuit state)
Switch SW3: Connection state (short-circuit state)
Switch SW4: Open state (open-circuit state)
Switch SW5: Arbitrary (low voltage Vss side FIG. 24)

The writing state illustrated in FIG. 25 and the confirmation state illustrated in FIG. 26 are repeatedly carried out, and then stopped when a desired current and a desired temperature coefficient as the current source are obtained. Thus, the adjustment of the output current of the nonvolatile storage element M is completed. Thereafter, the switches SW1 to SW5 are switched into the states illustrated in FIG. 24, whereby the nonvolatile storage element M can supply a current having the +0.3%/° C. temperature characteristic to the output circuit 6.

Figure 27:
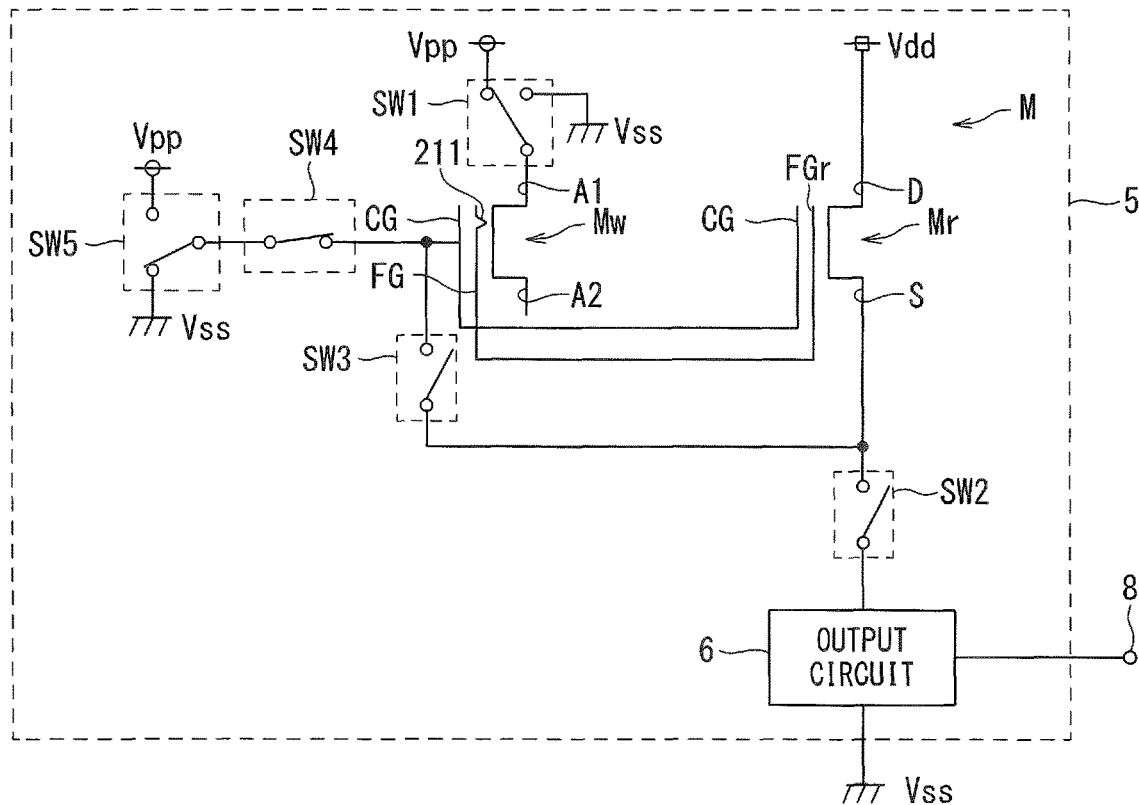
FIG. 27 is a circuit configuration diagram (No. 4) for explaining the temperature characteristic adjustment circuit 5 according to the second embodiment of the present invention.
Figure 28:
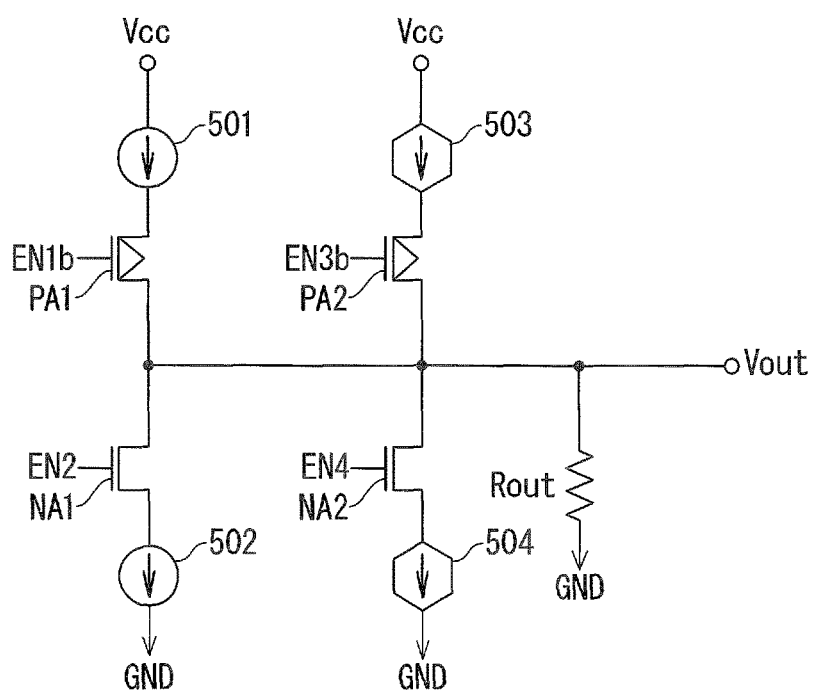
FIG. 28 is a circuit diagram illustrating a conventional voltage generation circuit.
Figure 29:
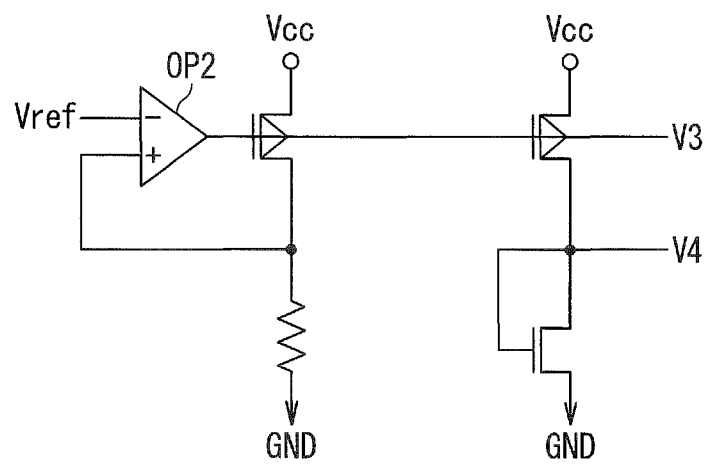
FIG. 29 is a circuit diagram illustrating a conventional constant current generation circuit.
Figure 30:
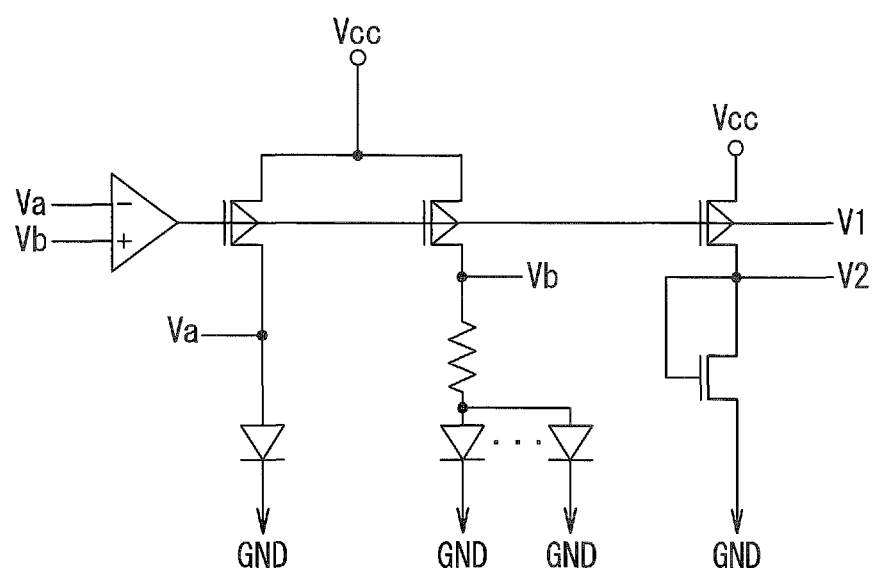
FIG. 30 is a circuit diagram illustrating a conventional current generation circuit.
Figure 31:
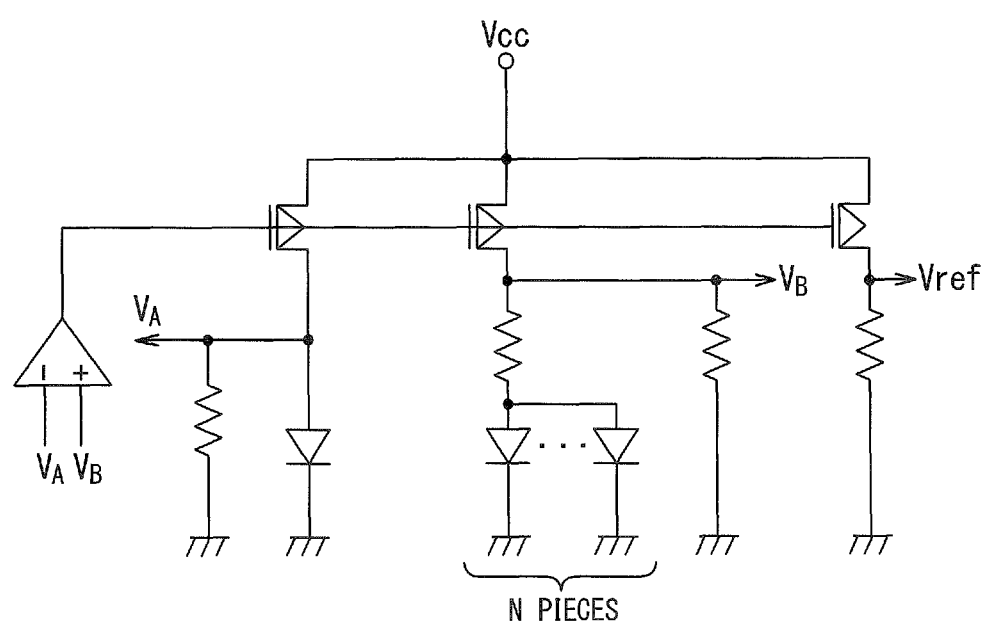
FIG. 31 is a circuit diagram illustrating a conventional band gap reference circuit.

Next, the case where the adjustment is performed so that a current from the current source has a negative temperature characteristic is described using FIG. 27 referring to FIGS. 20 and 24.

For example, a situation is assumed where a −0.3%/° C. temperature characteristic is required for the current source in order to achieve the temperature characteristic of an output signal. At this time, the nonvolatile storage element M serving as the current source needs to be adjusted so that the operating point is the operating point α− (operating point where the temperature coefficient is −0.3%/° C. at the control gate voltage Vcg of 0 V) as illustrated in FIG. 20.

When the switches SW1 to SW5 are brought into the switching states illustrated in FIG. 24 when the nonvolatile storage element Mr of the temperature characteristic adjustment circuit 5 illustrated in FIG. 24 operates at the operating point α−, a current having a −0.3%/° C. temperature characteristic is output to the output circuit 6 from the nonvolatile storage element M.

As illustrated in FIG. 27, the temperature characteristic adjustment circuit 5 switches the switches SW1 to SW5 into the following states when performing writing for operating the nonvolatile storage element M at the operating point α−. Herein, the case where the threshold voltage before the adjustment of the nonvolatile storage element M is higher than a desired threshold voltage is taken as an example.

Switch SW1: Pulse voltage Vpp side
Switch SW2: Open state (open-circuit state)
Switch SW3: Open state (open-circuit state)
Switch SW4: Connection state (short-circuit state)
Switch SW5: Low voltage supply terminal Vss side Therefore, the pulse voltage Vpp is applied to the first region A1 of the nonvolatile storage element Mw and the low voltage Vss is applied to the control gate region CG, and therefore electrons are released from the floating gate region FG (charge holding region) to the first region A1 through the charge inlet 211. Thus, the threshold voltage of the nonvolatile storage element M becomes low. On the contrary, when the low voltage Vss is applied to the first region A1 of the nonvolatile storage element Mw and the pulse voltage Vpp is applied to the control gate region CG, electrons are injected into the floating gate region FG (charge holding region) from the first region A1 through the charge inlet 211. Thus, the threshold voltage of the nonvolatile storage element Mw becomes high.

Thereafter, an output current of the nonvolatile storage element M serving as the current source is confirmed by the method described using FIG. 26. The writing state illustrated in FIG. 27 and the confirmation state illustrated in FIG. 26 are repeatedly carried out, and then stopped when a desired current and a desired temperature coefficient as the current source are obtained. Thus, the adjustment of the output current of the nonvolatile storage element M is completed. Thereafter, the switches SW1 to SW5 are switched into the states illustrated in FIG. 24, whereby the nonvolatile storage element M as the current source can supply a current having the −0.3%/° C. temperature characteristic to the output circuit 6.

As illustrated in FIGS. 24 to 27, the temperature characteristic adjustment circuit 5 can rewrite the threshold voltage of the nonvolatile storage element M to a value in which a current amount having a desired temperature characteristic is obtained, and finally output the current amount having a desired temperature characteristic in the state illustrated in FIG. 24 to the output circuit 6 by appropriately switching the switches SW1 to SW5. As described above, this embodiment can freely control the temperature characteristic of an output obtained from the temperature characteristic adjustment circuit 5. Moreover, the temperature characteristic adjustment circuit 5 according to this embodiment can adjust the charge amount of the floating gate region FG of the nonvolatile storage element Mw to adjust the threshold voltage, and therefore the same effects as those of the temperature characteristic adjustment circuit 3 according to the first embodiment are obtained.

Moreover, in the temperature characteristic adjustment circuit 5 in this embodiment, the current path in the charge injection and the charge release and the current path during the operation of the temperature characteristic adjustment circuit 5 can be separated from each other by being provided with the nonvolatile storage element M of the configuration illustrated in FIG. 23. Thus, the temperature characteristic adjustment circuit 5 can prevent unexpected rewriting of a nonvolatile storage element and can achieve an improvement of reliability.

The temperature characteristic adjustment circuits according to the first and second embodiments are high-quality analog circuits provided with a nonvolatile storage element as described above.

REFERENCE SIGNS LIST 1, 3, 5 temperature characteristic adjustment circuit
4 ammeter
6 output circuit
8 output terminal
10 well region
11, 13 N-type region
12, 14 N+ region
20, 70 insulator
21, 71 charge holding region
22, 72 gate insulation film
23, 73 lateral wall oxide film
24, 74 upper insulation film
25, 32 sidewall
41, 42 element separation region
51, 52, 53 contact plug
61 protective film
211 charge inlet
221 tunnel insulation film
A1 first region
A2 second region
B back gate
CG control gate region
D drain region
FG floating gate region
G gate region
M, Mr, Mw nonvolatile storage element
Q1, Q2 transistor
R resistor
S source region

The invention claimed is:

1. A temperature characteristic adjustment circuit comprising:
a current source configured to have a nonvolatile storage element having a control gate region and a source region and to be driven by application of a bias between the control gate region and the source region; and
an output circuit not having a nonvolatile storage element, in which temperature dependency of an output signal originating from temperature dependency of a current amount of a current output from the current source is adjusted by the nonvolatile storage element.

2. The temperature characteristic adjustment circuit according to claim 1, wherein the output circuit is configured to output a voltage output signal.

3. The temperature characteristic adjustment circuit according to claim 1, wherein the output circuit is configured to output a current output signal.

4. The temperature characteristic adjustment circuit according to claim 1, wherein a value of a current flowing in the current source and the output circuit is less than 100 nA.

5. The temperature characteristic adjustment circuit according to claim 1, wherein
the nonvolatile storage element has a charge inlet, and
the charge inlet is formed in a region not contacting a path of a current output from the current source.

6. The temperature characteristic adjustment circuit according to claim 2, wherein a value of a current flowing in the current source and the output circuit is less than 100 nA.

7. The temperature characteristic adjustment circuit according to claim 2, wherein
the nonvolatile storage element has a charge inlet, and
the charge inlet is formed in a region not contacting a path of a current output from the current source.

8. The temperature characteristic adjustment circuit according to claim 3, wherein a value of a current flowing in the current source and the output circuit is less than 100 nA.

9. The temperature characteristic adjustment circuit according to claim 3, wherein
the nonvolatile storage element has a charge inlet, and
the charge inlet is formed in a region not contacting a path of a current output from the current source.

10. The temperature characteristic adjustment circuit according to claim 4, wherein
the nonvolatile storage element has a charge inlet, and
the charge inlet is formed in a region not contacting a path of a current output from the current source.

\* \* \* \* \*